United States Patent [19]
Nagase

[11] Patent Number: 6,141,278
[45] Date of Patent: Oct. 31, 2000

[54] SEMICONDUCTOR MEMORY DEVICE ALLOWING FAST SUCCESSIVE SELECTION OF WORD LINES IN A TEST MODE OPERATION

[75] Inventor: Kouichi Nagase, Hyogo, Japan

[73] Assignee: Mitsubishi Denki Kabushiki Kaisha, Tokyo, Japan

[21] Appl. No.: 08/966,785

[22] Filed: Nov. 10, 1997

Related U.S. Application Data

[63] Continuation of application No. 08/589,357, Jan. 22, 1996, abandoned.

[30] Foreign Application Priority Data

Feb. 21, 1995 [JP] Japan ..................................... 7-032038

[51] Int. Cl.$^7$ .................................................. G11C 13/00
[52] U.S. Cl. ............................................. 365/222; 365/233
[58] Field of Search ..................................... 365/233, 222, 365/236

[56] References Cited

U.S. PATENT DOCUMENTS

| | | | |
|---|---|---|---|
| 5,347,491 | 9/1994 | Kagami | 365/233 |
| 5,477,491 | 12/1995 | Shirai | 365/233 |
| 5,495,452 | 2/1996 | Cha | 365/233 |
| 5,544,120 | 8/1996 | Kuwagata | 365/222 |

*Primary Examiner*—A. Zarabian
*Attorney, Agent, or Firm*—McDermott, Will & Emery

[57] ABSTRACT

A disturb mode control circuit designates a disturb mode for activating an internal cycle setting circuit in response to a predetermined state of an address signal at a terminal when a disturb mode designating signal applied from a control circuit is active. The activated internal cycle setting circuit continuously issues a clock signal having a predetermined period to the control circuit. In accordance with the mode detection signal applied from the disturb mode control circuit and the clock signal applied from the internal cycle setting circuit, the control circuit successively generates an internal address signal in synchronization with the clock signal applied from an internal address generating circuit for selecting the word line in a memory cell array.

20 Claims, 23 Drawing Sheets

SEMICONDUCTOR MEMORY DEVICE ALLOWING FAST SUCCESSIVE SELECTION OF WORD LINES IN A TEST MODE OPERATION

This application is a continuation of application Ser. No. 08/589,357 filed Jan. 22, 1996 now abandoned.

BACKGROUND OF THE INVENTION

1. Field of the Invention

The present invention relates to a semiconductor memory device, and in particular to a structure for testing a semiconductor memory device at high speed. More specifically, the invention relates to a structure for rapidly and successively selecting word lines in a semiconductor memory device during a testing operation.

2. Description of the Background Art

FIG. 30 schematically shows a whole structure of a dynamic semiconductor memory device in the prior art. The dynamic semiconductor memory device may be a virtual static random access memory (VSRAM), a pseudo-static random access memory (PSRAM) and a dynamic random access memory (DRAM). FIG. 30 illustrates a structure of the dynamic random access memory as a representative example.

In FIG. 30, a dynamic semiconductor memory device 1 includes a control circuit 6 which receives external control signals /W, /OE, /RAS and /CAS through external control signal input terminals (nodes) 2–5 and generates internal control signals, a memory array 7 having memory cells arranged in a matrix as described later in detail, an address buffer 9 which receives external address signals A0–Ai through an address signal input terminals (nodes) 8 and generates an internal row address signal and an internal column address signal under the control of control circuit 6, an internal address generating circuit 10 which is controlled by control circuit 6 to generate a refresh row address signal for designating a row to be refreshed in a refreshing operation, a multiplexer 11 which is controlled by control circuit 6 to pass selectively the address signals from address buffer 9 and internal address generating circuit 10, and a row decoder 12 which is activated under the control of control circuit 6 to decode the internal row address signal from multiplexer 11 for selecting a row (word line) in memory array 7.

Signal /W applied to external control signal input terminal (node) 2 is a write enable signal instructing a data writing operation. Signal /OE applied to external control signal input terminal (node) 3 is an output enable signal instructing a data output operation. Signal /RAS applied to external control signal input terminal (node) 4 is a row address strobe signal starting internal operation of the semiconductor memory device and determining an active period of the internal operation. When signal /RAS is active, circuits such as row decoder 12 related to the operation of selecting a row in memory array 7 are made active. Signal /CAS applied to external control signal input terminal (node) 5 is a column address strobe signal activating circuits related to selection of a column in memory array 7. Functions of these external control signals will be described later in detail.

Semiconductor memory device 1 further includes a column decoder 13 which is activated under the control of control circuit 6 to decode the internal column address signal applied from address buffer 9 to generate a column select signal for selecting a column in memory array 7, sense amplifiers for sensing and amplifying data of memory cells connected to the selected row in memory array 7, I/O gates responsive to the column select signal applied from column decoder 13 to connect the selected column in memory array 7 to an internal data bus a1, an input buffer 15 which is controlled by control circuit 6 to produce internal write data from external write data DQ0–DQj applied to data I/O terminals 17 for transmission onto internal data bus a1 in a data writing operation, and an output buffer 16 which is controlled by control circuit 6 to produce external read data DQ0–DQj from internal read data read onto internal data busa1 for supplying to data I/O terminal 17 in a data reading operation. In FIG. 30, sense amplifiers and I/O gates are indicated by one block 14. Input buffer 15 is activated to produce the internal write data when both signals /W and /CAS are activated to attain a logical low level. Output buffer 16 is activated in response to activation of output enable signal /OE.

FIG. 31 shows an internal structure of memory array 7 shown in FIG. 30. In FIG. 31, memory array 7 includes a plurality of word lines WL arranged corresponding to respective rows of the memory cells and each connected to memory cells in the corresponding row, and a plurality of bit line pairs BL and /BL arranged corresponding to respective columns of memory cells and each connected to the memory cells in the corresponding column. In FIG. 31, there are representatively shown word lines WL0, WL(l–1), WL1 and WL(l+1) and a pair of bit lines BL and /BL.

Each memory cell is arranged corresponding to a crossing of a bit line pair and a word line. In FIG. 31, there are representatively shown a memory cell MCa arranged corresponding to the crossing of word line WL(l–1) -and bit line /BL, a memory cell MCb arranged corresponding to the crossing of word line WL1 and bit line BL, and a memory cell MCc arranged corresponding to the crossing of word line WL(l+1) and bit line /BL. Each of memory cells MCa–MCc includes a capacitor 23 storing information in the form of electric charges, and an access transistor 22 which is turned on to connect a corresponding bit line (BL or /BL) to capacitor 23 in response to a signal potential on the corresponding word line. Access transistor 22 is formed of an n-channel MOS (insulated gate field-effect) transistor.

Row select signal is transmitted onto a word lines WL (WL0–WL(l+1)) from row decoder 12. One sense amplifier contained in block 14 is arranged corresponding to each bit line pair BL and /BL, and differentially amplifies potentials of the corresponding bit line pair BL and /BL. Operation of the semiconductor memory device shown in FIGS. 30 and 31 will be described below with reference to FIG. 32 which is an operation waveform diagram.

FIG. 32 illustrates an operation waveform during data reading.

When signal /RAS is at a high level of the inactive state, semiconductor memory device 1 is in a standby state. In this state, all the row select signals applied from row decoder 12 are inactive, and the potential of each word line WL is at the low level of the inactive state. Bit lines BL and /BL have been precharged to a predetermined potential, e.g., of Vcc/2 (where Vcc is an operation power supply voltage) by a precharging/equalizing circuit (not shown).

When signal /RAS attains the active state of the low level, a memory cycle starts, and row selecting operation starts. Prior to start of the row selecting operation, the operation of precharging bit lines BL and /BL is stopped, and bit lines BL and /BL are in an electrically floating state at a precharged potential.

Address buffer 9 responds to the control signal applied from control circuit 6 via a control signal path a3 to take in external address signals A0–Ai received via address signal input terminals (nodes) 8 and outputting internal row address signal onto internal address bus a4. Internal address bus a4 in FIG. 30 is shown having a bit width of (i+1). However, if address buffer 9 are adapted to output pairs of complementary address signals, internal address bus a4 has a bit width of 2(i+1). Multiplexer 11 is controlled by control circuit 6 to select and apply the internal address signal applied from address buffer 9 to row decoder 12 in the normal operation mode. Row decoder 12 decodes the applied internal address signal, and generates and transmits the row select signal onto the addressed word line in memory array 7. Thereby, the potential of the selected word line WL rises to the high level.

It is assumed that word line WL1 is selected. In this state, access transistor 22 of memory cell MCb is turned on to connect capacitor 23 to bit line BL. If memory cell MCb has stored data of the high level, the potential of bit line BL slightly rises as shown in FIG. 32. Meanwhile, there is no memory cell connected to bit line /BL, so that bit line /BL maintains the precharged potential. Then, the sense amplifier circuit contained in block 14 is activated to amplify differentially the potentials of bit lines BL and /BL, so that the potential of bit line BL onto which data of the high level is read rises to the operation power supply voltage Vcc level, and bit line /BL is discharged to the low level of the ground potential level.

When signal /CAS is activated to attain the low level, address buffer 9 is controlled by control circuit 6 to take in, as the column address signal, external address signals A0–Ai applied to address signal input terminals (nodes) 8 and produce the internal column address signal for transmission onto internal address bus a4. After the sense amplifier is activated and the potentials of bit lines BL and /BL are fixed, column decoder 13 is activated under the control of control circuit 6 to decode the internal column address signal applied from address buffer 9 and produce the column select signal for outputting. In response to this column select signal, the I/O gates which are contained in block 14 and are provided corresponding to the respective bit line pairs are selectively turned on, and the bit line pairs arranged corresponding to the columns designated by the column select signal are connected to internal data bus a1. In the data reading operation, output enable signal /OE is activated to attain the low level, and responsively output buffer 16 is activated under the control of control circuit 6 to produce the external read data from the internal read data onto the internal data bus a1 for transmission onto data I/O terminals 17. In the data reading operation, write enable signal /W is maintained at the high level of the inactive state. In the data writing operation, the timing at which the internal write data is transmitted onto internal data bus a1 corresponds to the timing at which both signals /W and /CAS are activated.

Word lines WL are arranged in parallel with each other at the same interconnection layer, and are electrically isolated from each other by an insulating film. Therefore, a parasitic capacitance exists between the word lines as shown in FIG. 31. In FIG. 31, there are representatively shown a parasitic capacitance 25b between word lines WL(l−1) and WL1 as well as a parasitic capacitance 25b between word lines WL and WL(l+1). Such parasitic capacitances exist not only between the adjacent word lines but also between word lines remote from each other. Bit line pairs BL and /BL and word lines WL are formed at different interconnection layers in directions crossing with each other. Therefore, parasitic capacitances exist at portions crossing each other with an interlayer insulating film therebetween. In FIG. 31, there is representatively shown a parasitic capacitance 26 between bit line BL and word line WL(l−1). Operational effect of parasitic capacitances 25a, 25b and 26 will now be described below.

FIG. 33 shows a distribution of parasitic capacitances between word lines and between word lines and bit lines more in detail. In FIG. 33, there are shown two word lines WLa and WLb and a pair of bit lines BL and /BL. Memory cell MCd is arranged corresponding to the crossing of bit line BL and word line WLa, and memory cell MCe is arranged corresponding to the crossing of bit line /BL and word line WL. A predetermined reference voltage (generally, Vcc/2) Vcp is applied to the electrode of capacitor 23. A parasitic capacitance 25c exists between word lines WLa and WLb, a parasitic capacitance 25d exists between word line WLa and another word line (not shown), and a parasitic capacitance 25e exists between word line WLb and another word line (not shown). A parasitic capacitance 26a exists between word line WLa and bit line BL, a parasitic capacitance 26b exists between bit line BL and word line WLb, and a parasitic capacitance 26d exists between bit line /BL and word line WLb.

The sense amplifier circuit provided corresponding to each bit line pair includes a P-sense amplifier 27 which is activated in response to a sense amplifier activating signal φSP to charge one at a higher potential of bit lines BL and /BL to the operation power supply voltage level, and an N-sense amplifier 28 which is activated in response to a sense amplifier activating signal φSN to discharge the other at a lower potential of bit lines BL and /BL to the ground potential level.

Action of the parasitic capacitances shown in FIG. 33 will be described below with reference to an operation waveform diagram of FIG. 34. FIG. 34 illustrates the operation in the case where word line WLa is selected and memory cell MCd has stored data of the high level (Vcc level).

When word line WLa is selected, its potential rises. The rise of potential of selected word line WLa is transmitted onto word line WLb owing to capacitive coupling by parasitic capacitance 25c, so that the potential of word line WLb slightly rises. In FIG. 34, the rise of potential of nonselected word line WLb caused by this capacitive coupling is shown causing ringing (the ringing occurs by the fact that a word driver included in row decoder 12 and provided corresponding to each word line maintains the potential level of the nonselected word line at the ground voltage level, i.e., low level).

When the potential of selected word line WLa rises, access transistor 22 in memory cell MCd is turned on, so that electric charges accumulated in capacitor 23 are transmitted onto bit line BL to raise the potential of bit line BL by ΔR. When read voltage ΔR on bit line BL increases to a sufficiently large value, sense amplifier activating signals φSN and φSP are activated. In general, sense amplifier activating signal φSN is first activated, so that N-sense amplifier 28 operates, and the potential of bit line /BL which has been in an electrically floating state at the precharged potential is discharged to the ground potential level. Then, sense amplifier activating signal φSP is activated, so that P-sense amplifier 27 operates to charge the potential of bit line BL to the operation power supply voltage Vcc level. During rise of the potential of bit line BL, the potential of nonselected word line WLb also rises due to capacitive coupling of parasitic capacitance 26b. When the potential of bit line /BL is discharged to the ground level during the operation of N-sense amplifier 28, the potential of nonselected word line WLb is already at the ground potential level, and, in the case of its capacitive coupling during the N sense amplifier operation, the access transistor of nonselected memory cell MCe is turned off more strongly, which state is not related particularly to "disturb" to be described later, and thus the waveform thereof is not shown.

When the potential of selected word line WLa falls from the high level to the low level upon termination of one memory cycle, the potential of word line WLb lowers through capacitive coupling by parasitic capacitance 25c. At this time, the potential of bit line /BL which has been discharged to the ground potential level by N-sense amplifier 28 lowers through parasitic capacitance 26c.

The above floating up of potential of nonselected word line WLb causes a problem of "disturb" that the quantity of electric charges accumulated in capacitor 23 of nonselected memory cell MCe is changed, and data stored in the memory cell changes, as will be described below in detail.

FIGS. 35A–35C show a manner of the disturb of memory cell data at the time of floating up of the word line potential.

As shown in FIG. 35A, when the potential of nonselected word line WLb rises at the time of rise of the potential of selected word line WLa (at A in FIG. 34), access transistor 22 is weakly turned on in the case where data of the high level (Vcc) is stored in capacitor 23 of the memory cell connected to nonselected word line WLb, so that charges Q flow from capacitor 23 onto bit line /BL. It is not essential that floating up value ΔV1 of the potential of nonselected word line WLb is equal to or greater than the threshold voltage of access transistor 22. Even if the potential of nonselected word line WLb rises up to the threshold voltage level of access transistor 22, charges Q flow from capacitor 23 to bit line /BL, because its subthreshold current increases.

In FIG. 35B, P-sense amplifier 27 operates, the potential of bit line BL rises and its parasitic capacitance 26b raises the potential of nonselected word line WLb. At this time, the potential of bit line /BL is at the ground potential Vss level, and charges Q at the high level (Vcc level) accumulated in capacitor 23 of the memory cell flow onto bit line /BL.

As shown in FIG. 35C, when parasitic capacitance 26c shown in FIG. 33 lowers the potential of bit line /BL to a negative potential −ΔVb during transition of selected word line WLa to the nonselected state, charges Q of high level data accumulated in capacitor 23 related to nonselected word line WLb flow onto bit line /BL if the potential of nonselected word line WLb is equal to the ground potential Vss or negative potential −ΔVa.

The flow of accumulated charges occurs not only during data reading but also during data writing. More specifically, this occurs when the word line is set to the selected state and when the sense amplifier operates.

In the case where capacitor 23 has stored data at the low level, the source of the access transistor is a node connected to capacitor 23, and the capacitance of capacitor 23 is significantly small as compared with the capacitances of bit lines BL and /BL, so that even a small amount of electric charges flown into capacitor 23 raises the potential of capacitor 23. Whereby, potentials of the gate and source of access transistor 22 becomes equal to each other, and thus flow of the electric charges via the access transistor stops. Therefore, the amount of charges of memory cell capacitor 23 storing data of the low level is increased but does not exceed a limited level.

However, in the case where data of the high level has been stored, electric charges flow from the memory cell capacitor to the corresponding bit line upon each operation of selecting a word line, so that the potential of the memory cell capacitor lowers as shown in FIG. 36. FIG. 36 shows variation in the potential of word line WL(l) in the case where word lines WL(l−1), WL(l+1), WL(l+2) . . . are successively selected. In general, a capacitance value of the memory cell capacitor is determined to have a margin for leak of charges during operation. However, the capacitance value of the memory cell capacitor may decrease due to variation in manufacturing parameters such as thickness of a capacitor insulating film and an area of opposing portions of capacitor electrodes, in which case such a problem occurs that even leak of a small amount of electric charges lowers the electrode potential of the capacitor, resulting in inversion of stored data.

As summing that C represents the capacitance value of memory cell capacitor 23 and Q represents the amount of accumulated charges, the following formula is obtained, where cell plate potential Vcp is equal to Vcc/2.

$$Q = C \cdot Vcc/2$$

Assuming that electric charges of a quantity ΔQ leak at a time, variation ΔV of electrode potential of the capacitor can be expressed by the following formula:

$$\Delta Q = C \cdot \Delta V$$

Therefore, if the capacitance value C of capacitor 23 decreases, potential variation ΔV increases even if the quantity ΔQ of electric charges flown out therefrom is constant. Therefore, as shown in FIG. 36, the electrode potential of capacitor of a defective cell having a smaller capacitance value lowers to a large extent as compared with an extent of change of the electrode potential of capacitor of a normal memory cell indicated by broken line.

A so-called "disturb" test is one of tests for detecting existence of such a defective cell.

In this disturb test, word lines other than the word line connected to the memory cell of interest are selected predetermined number of times (disturb times), and it is determined whether the memory cell of interest accurately holds data or not. In this disturb test, the disturb test is effected simultaneously on a large number of semiconductor memory devices.

FIG. 37 schematically shows a structure for executing the disturb test. In FIG. 37, a plurality of semiconductor memory devices DR11–DRmn are arranged on a test board TB. FIG. 37 illustrated a state where semiconductor memory devices DR11–DRmn are arrange in m rows and n columns on test board TB. Semiconductor memory devices DR11–DRmn are connected via a signal bus SG. Test board TB is connected to a test unit TA. Test unit TA applies signals onto signal bus SG. During testing, disturb test is effected simultaneously on these semiconductor memory devices DR11–DRmn. Initially in the disturb test, data of the high level is written into semiconductor memory devices DR11–DRmn. Then, test unit TA applies row address strobe signal /RAS and address signals onto signal bus SG, so that semiconductor memory devices DR11–DRmn operate to select the word lines and activate the sense amplifier circuits. By repeating this word line selection predetermined number of times, respective word lines WL connected to the memory cells are influenced by noises, and charges leak from the memory cell capacitors. After the predetermined number of times of operation of selecting the word line and activating the sense amplifier circuits, it is determined whether data stored in semiconductor memory devices DR11–DRmn are of the high level or not. Test unit TA executes this determination.

As the storage capacity of the semiconductor memory device increases, the word lines contained therein increase in number. This results in disadvantageous increase of the time required for the disturb test in which the word lines are successively selected. In order to reduce the test time, such a method may be envisaged that control signal /RAS transmitted from test unit TA in FIG. 37 onto signal bus SG is changed rapidly so as to reduce the time period for which the word line is at the selected state. However, a large number of semiconductor memory devices DR11–DRmn are connected to signal bus SG, and large parasitic capacitances Cp exist at signal bus SG as shown in FIG. 37. Therefore, the interconnection line resistance of signal bus SG and the large parasitic capacitances CP cause signal propagation delay, and required signals cannot be changed fast.

FIGS. 38A and 38B illustrate change in control signal /RAS and an address signal on signal bus SG. FIG. 38A shows ideal signal waveforms on signal bus SG, and FIG. 38B shows signal waveforms on signal bus SG in the conventional disturb test. In the ideal state shown in FIG. 38A, signal /RAS changes with predetermined rising and falling times without being influenced by delay in signal propagation. The address signal requires a set-up time Ts and a hold time Th with reference to signal /RAS. Set-up time Ts is a time required for establishing and maintaining the fixed state prior to falling of signal /RAS. Hold time Th is a time required for maintaining the fixed state of address signal after the falling of signal /RAS.

Meanwhile, in the case where parasitic capacitance Cp of signal bus SG is large, the rising time and falling time of control signal /RAS increase, e.g., to 50 ns (nanoseconds) due to delay in signal propagation on signal bus SG, so that fast change thereof is impossible. In this case, the changing speed of the address signal also decreases. In order to ensure the intended address set-up time Ts, it is necessary to change the address signal at the timing preceding the timing of change of the address signal of the ideal waveform (FIG. 38A). In order to change the address signal while control signal /RAS is at the high level of the inactive state, the period of inactive state of control signal /RAS must be made longer than that of the ideal waveform. This results in increase of the time of one cycle (word line selecting cycle) of the disturb test, so that successive selection of the word lines cannot be performed fast, and thus the disturb test time cannot be reduced.

The above problem that fast and successive selection of the word lines cannot be performed in the test operation arises also in an acceleration test such as a "burn-in" test. In the "burn-in" test, semiconductor memory devices are operated under the conditions of high temperature and high humidity to exclude defective products before marketing by making manifest latent initial failures in components such as a failure in a gate insulating film of an MOS transistor, failure in an interlayer insulating film between interconnections, a failure in interconnections and a failure caused by particles mixed at manufacturing steps. In the acceleration test such as a burn-in test, only operating conditions of the semiconductor memory device are changed, and the semiconductor memory device operates in the same manner as in the normal operation in accordance with control signals applied from an externally arranged test unit. Therefore, the word lines are successively selected also in this acceleration test, so that the test time cannot be reduced. This problem arises also in another test such as a life-time test.

Semiconductor memory devices employs different specification values such as operation conditions for different families. If different design rules are employed, the word line pitch and memory capacitor capacitance take different values, and the degree of floating up of the word line potential and the variation of the potential of the memory capacitor take different values. Therefore, depending on the family member of the semiconductor memory device, word line select cycle period (i.e., period for which the word line is in the selected state) and the number of times of word line selection must be changed. Such change of the test conditions requires change in a program operating the test unit, resulting in such a problem that the test conditions cannot be changed flexibly and easily depending on the family member of the semiconductor memory device to be tested.

SUMMARY OF THE INVENTION

An object of the invention is to provide a semiconductor memory device which can provide fast operation in a particular operation mode such as a disturb test.

Another object of the invention is to provide a semiconductor memory device which can perform fast and successive selection of word lines in a particular operation mode without being restricted by an external control signal.

Still another object of the invention is to provide a semiconductor memory device which can easily and internally set the cycle period of word line selection and the number of times of word line selection.

In summary, according to the invention, a semiconductor memory device is internally provided with a clock generating circuit which is activated in a particular operation mode to generate continuously a clock signal, and the clock signal is used as a word line selection operation activating signal.

When the particular operation mode is designated, the clock signal is generated internally and continuously, and a row selecting operation is performed in synchronization with the clock signal. Independent from the control of an external control signal, the semiconductor memory device automatically and internally performs the row selecting operation, so that row selection is performed rapidly and continuously without being influenced by toggle of the external control signal and delay in signal propagation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
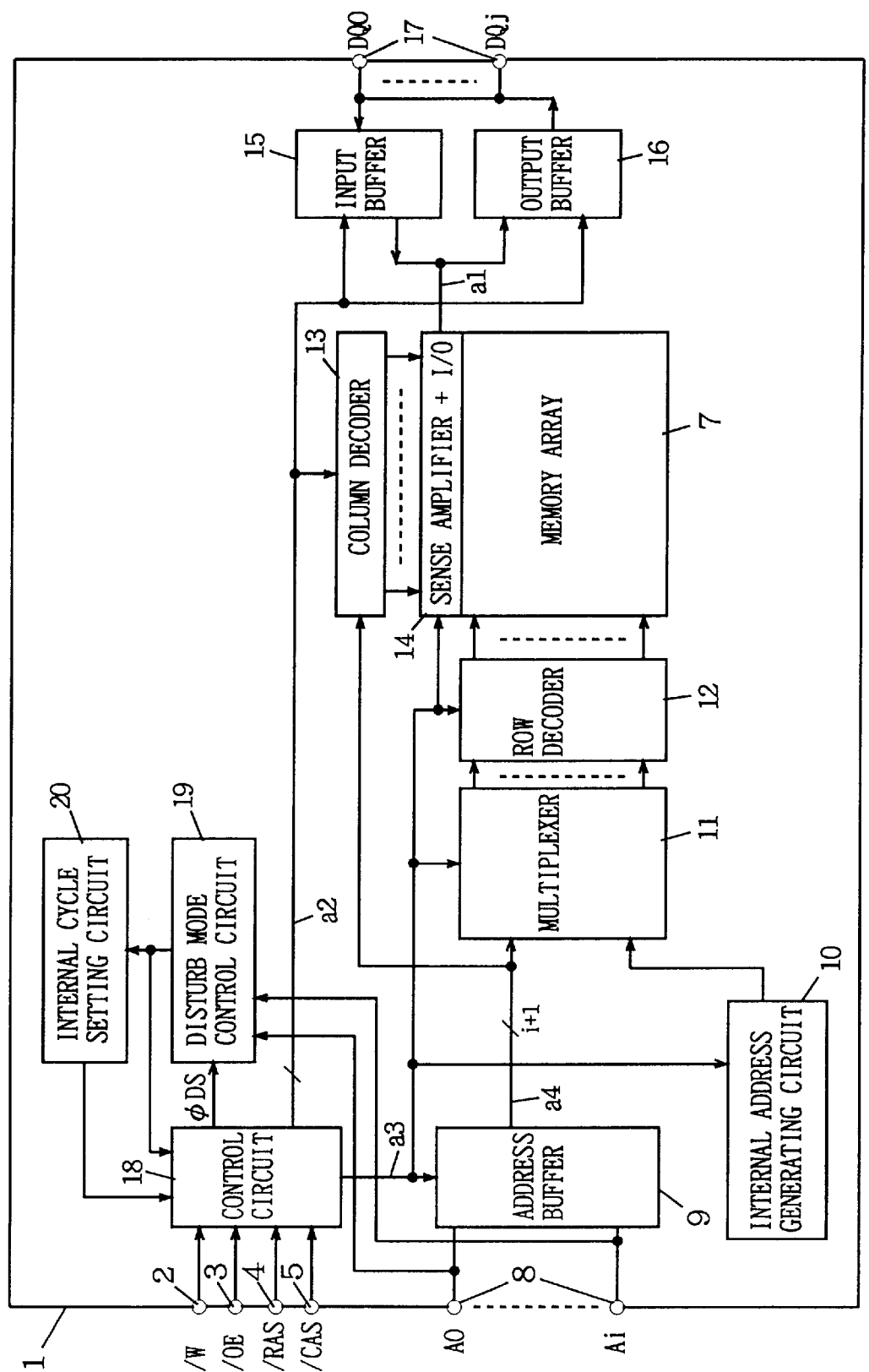
FIG. 1 schematically shows a whole structure of a semiconductor memory device of an embodiment of the invention.
Figure 30:
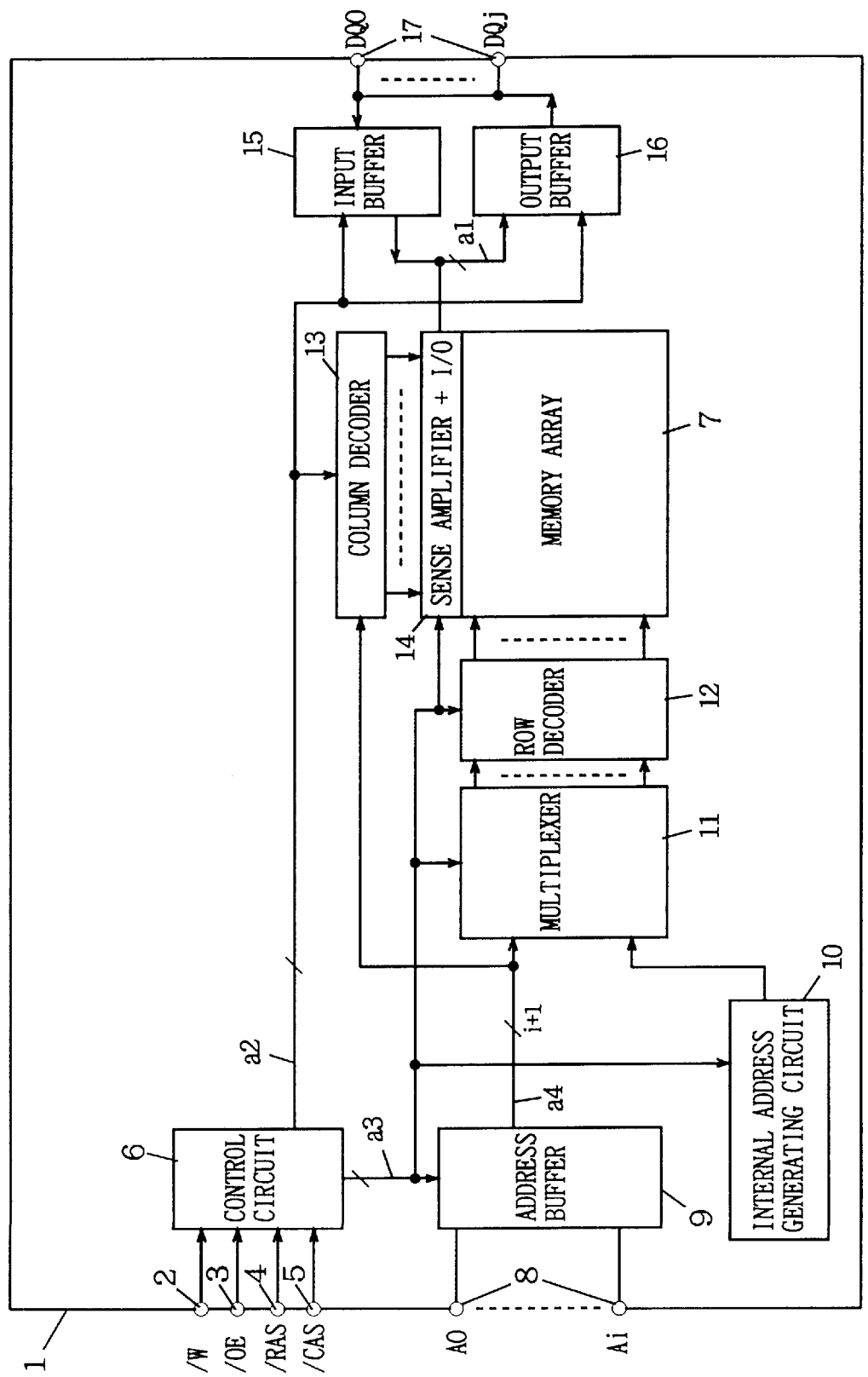
FIG. 30 schematically shows a whole structure of a conventional semiconductor memory device.
Figure 31:
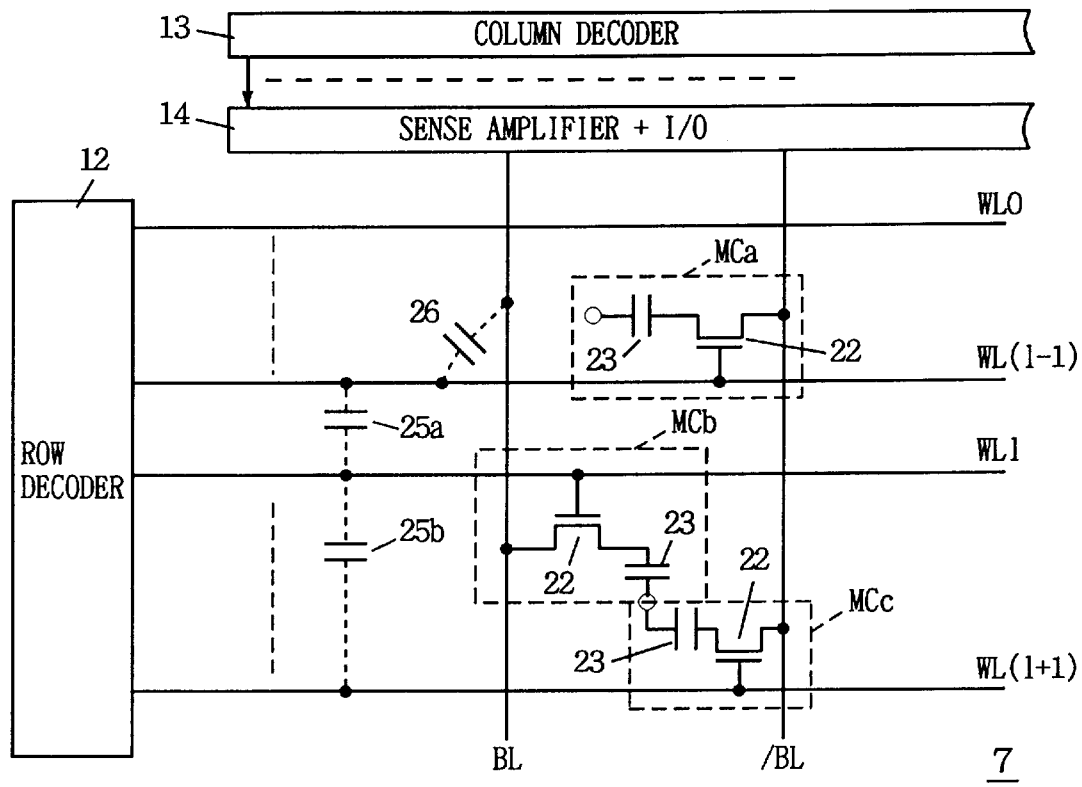
FIG. 31 shows a structure of a memory array shown in FIG. 30.
Figure 32:
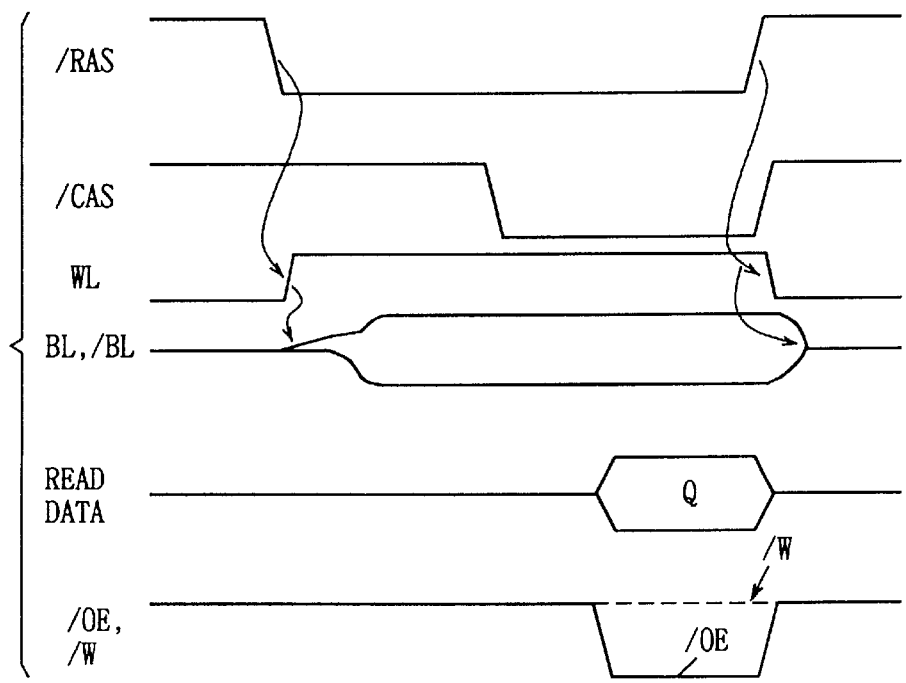
FIG. 32 is a signal waveform diagram representing operation of a conventional semiconductor memory device.
Figure 33:
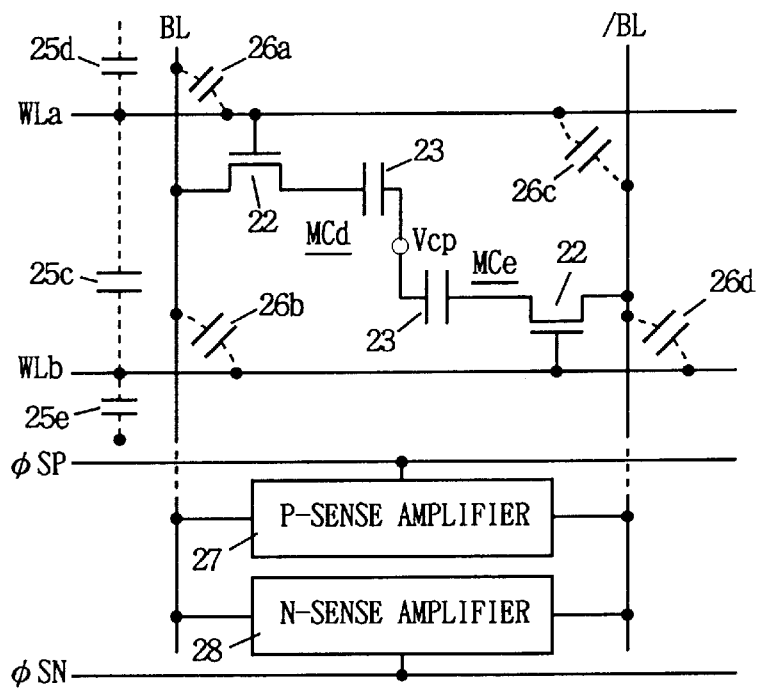
FIG. 33 illustrates a problem of the conventional semiconductor memory device.
Figure 34:
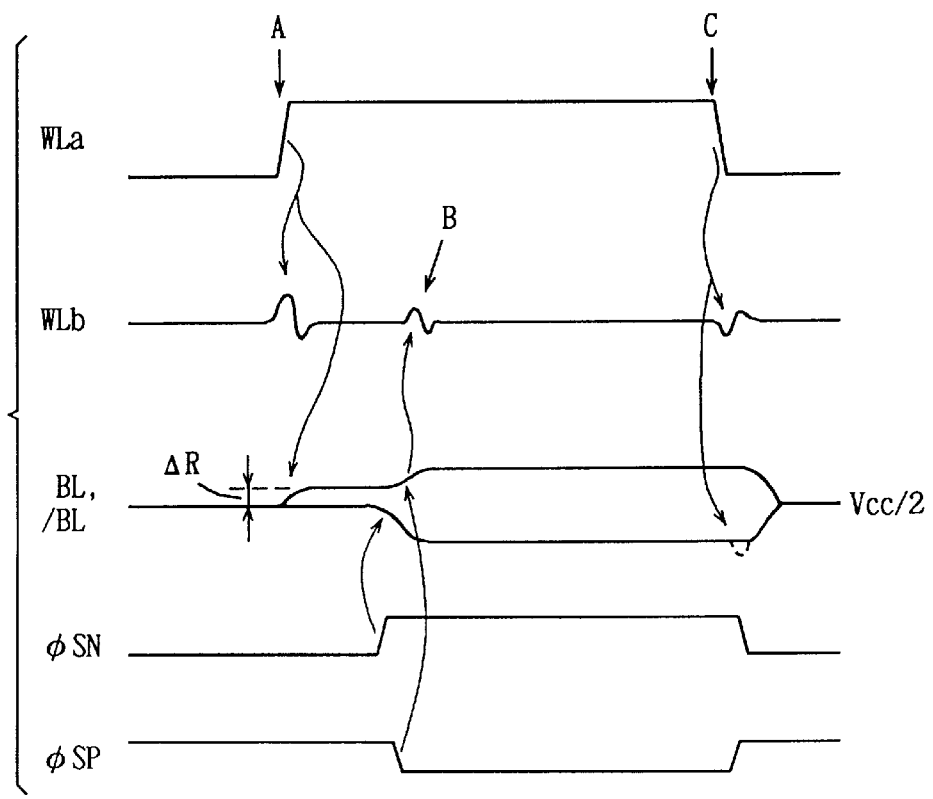
FIG. 34 is a signal waveform diagram representing operation of the memory array shown in FIG. 33.
Figure 35A:
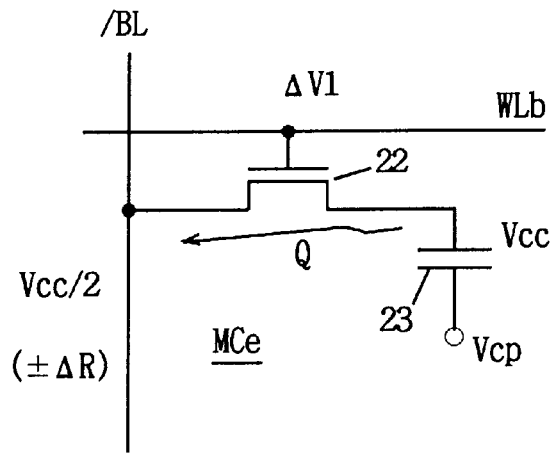
FIGS. 35A–35C show a problem of the conventional semiconductor memory device.
Figure 35B:
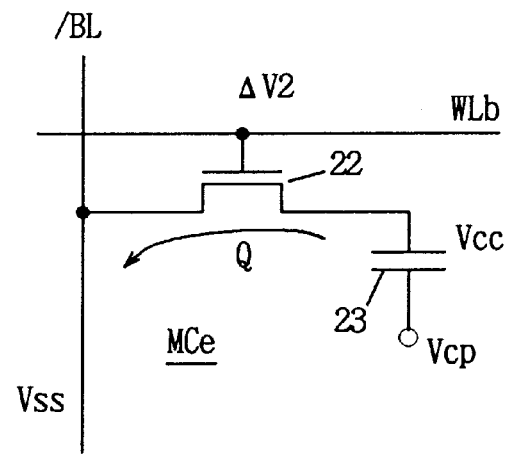
Figure 35C:
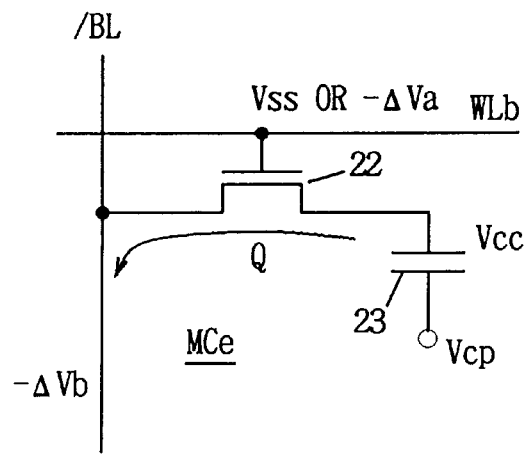
Figure 36:
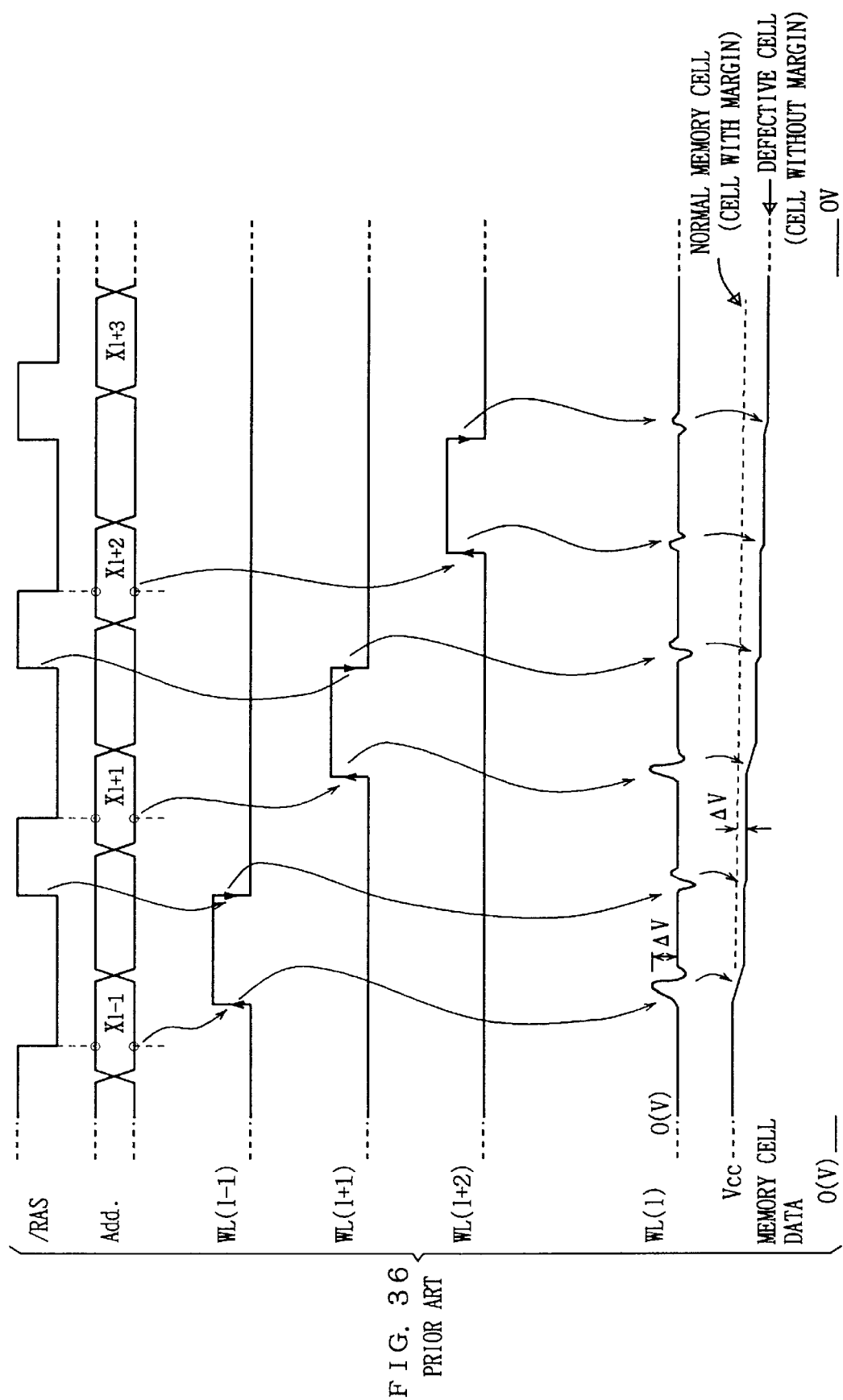
FIG. 36 shows a problem of the conventional semiconductor memory device.
Figure 37:
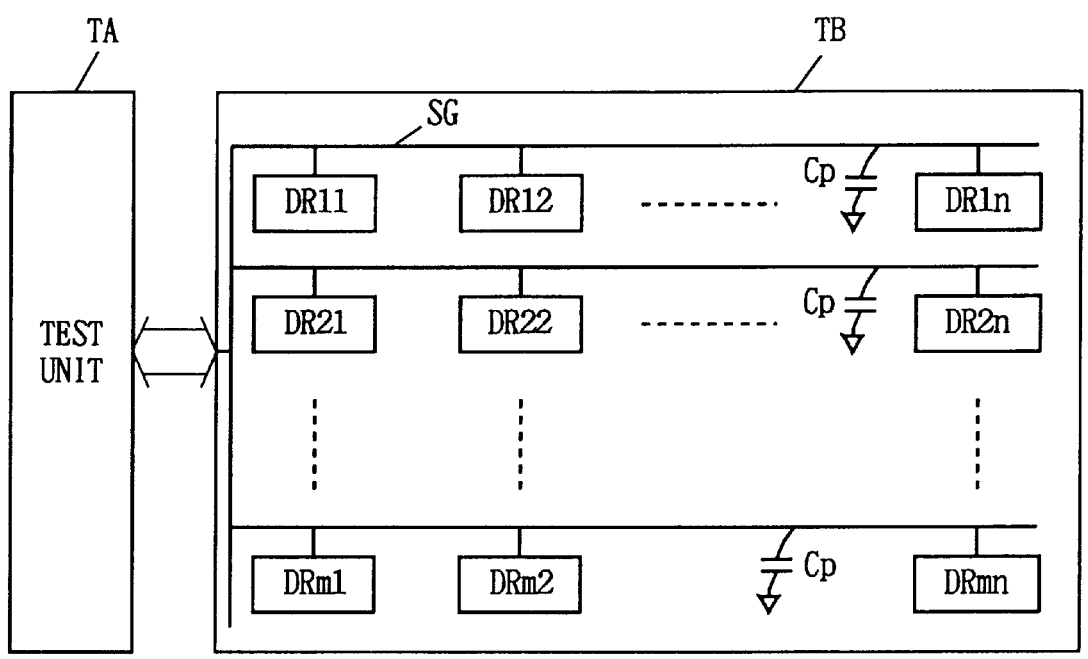
FIG. 37 schematically shows a testing arrangement in a conventional memory device.
Figures 38A, 38B:
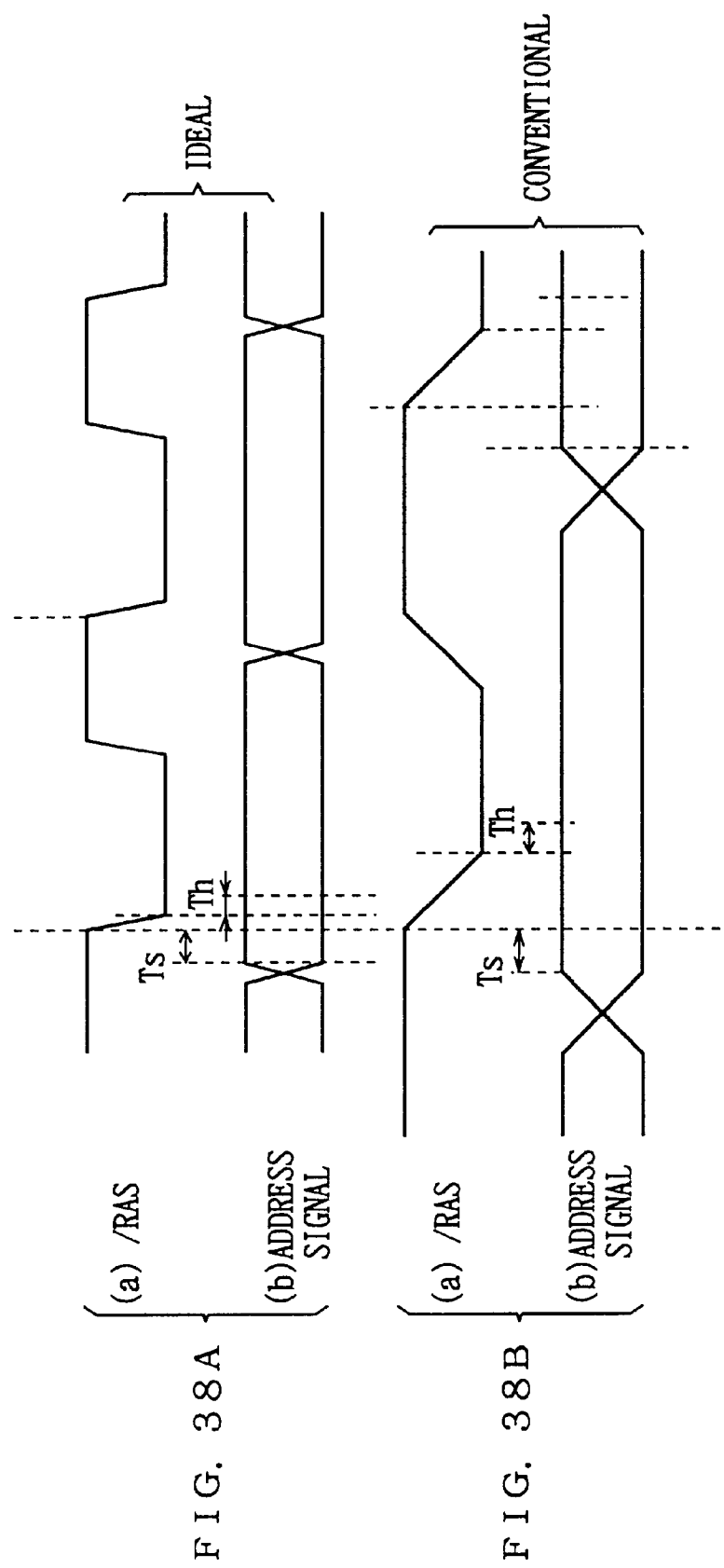
FIGS. 38A and 38B show manners of transmission of external control signals in the arrangement shown in FIG. 37.

FIG. 1 schematically shows a whole structure of a semiconductor memory device according to an embodiment of the invention. In FIG. 1, semiconductor memory device 1 includes a control circuit 18 which receives external control signals /W, /OE, /RAS and /CAS and generates various internal control signals, a disturb mode control circuit 19 which detects whether a particular operation mode is designated or not in response to a particular mode designating signal φDS applied from control circuit 18 and address signals A0–Ai applied to an address signal input terminals 8, and an internal cycle setting circuit 20 which generates a clock signal having a predetermined frequency or cycle in response to a particular operation mode detecting signal applied from disturb mode control circuit 19. The clock signal applied from internal cycle setting circuit 20 is applied as a row selection operation activating signal (internal RAS) to control circuit 18. Control circuit 18 activates the row selection operation activating signal in synchronization with the clock signal applied from internal cycle setting circuit 20 when the particular operation mode is designated. Other structures are the same as those of the conventional semiconductor memory device shown in FIG. 30, and the corresponding portions bear the same reference numbers.

Figure 2:
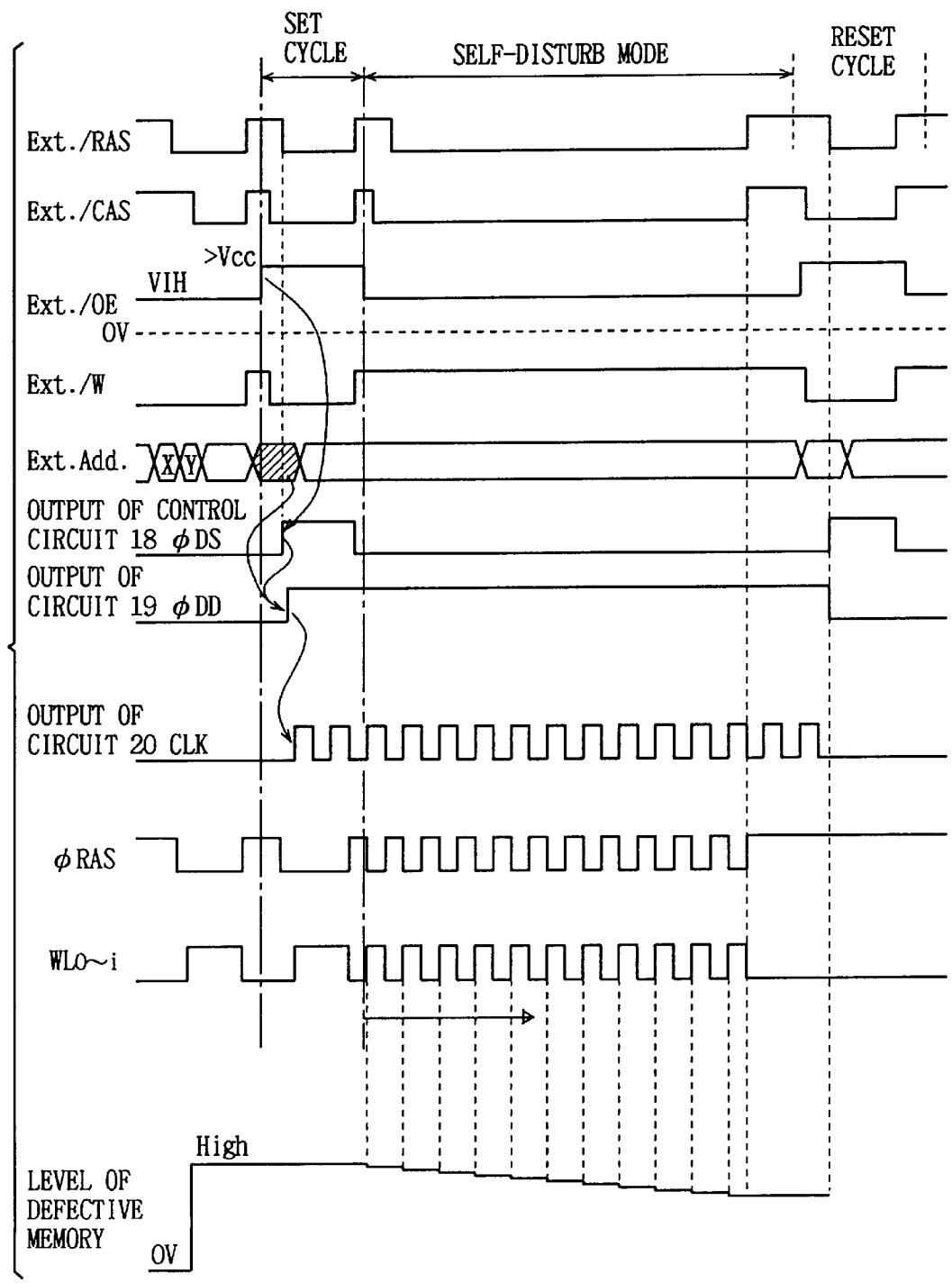
FIG. 2 is a waveform diagram representing operation of the semiconductor memory device of the invention.

Operation of the semiconductor memory device according to the invention will be briefly described below with reference to a timing chart of FIG. 2.

Although the particular operation mode may be any of operation modes in which word lines are successively selected, the following description will be given on the "disturb" test.

Before the disturb test, data of the high level is written into each memory cell. In the data write cycle, output enable signal /OE is set to the high level, and write enable signal /W is set to the low level of the active state. Upon each toggle of external control signals /RAS and /CAS (Ext./RAS and Ext./CAS), external address signals A0–Ai (Ext.Add) are taken in as the row address signal (X) and column address signal (Y). When external control signal /RAS (Ext.RAS) is activated, internal row address strobe signal /RAS applied from control circuit 18 is activated, and row selecting operation is performed to select word line WL using internal row address strobe signal /RAS as word line selection operation activating signal φRAS. Data is written into the memory cell, which is designated by column address signal Y, among the memory cells connected to the selected word line.

A self-disturb test mode of the present invention includes three cycles, i.e., (1) set cycle for setting the self-disturb test, (2) self-disturb mode for actually performing the disturb test, and (3) reset cycle for resetting the disturb test.

In the set cycle, and particularly prior to falling of external control signal /RAS (Ext.RAS), both signals /CAS and /W are set to the low level of the active state, and output enable signal /OE is set to a voltage level sufficiently higher than a high level (VIH) set in the normal operation. Thus, the disturb mode is set under so-called "WCBR+super-Vcc" condition. If the above condition is satisfied, control circuit 18 activates disturb mode designating signal φDS and signals that the disturb mode is designated to disturb mode control circuit 19.

When disturb mode designating signal φDS is active, disturb mode control circuit 19 takes in predetermined address signals among address signals A0–Ai applied to address signal input terminals 8. When the address signals thus taken in satisfy a predetermined combination of the states, disturb mode control circuit 19 determines that the disturb mode is designated, and issues disturb mode designating signal φDD to internal cycle setting circuit 20 and control circuit 18. Internal cycle setting circuit 20 responds to disturb mode designating signal φDD applied from disturb mode control circuit 19 by continuously generating a clock signal CLK with a predetermined cycle. In this state, control circuit 18 does not yet allow pass of clock signal CLK applied from internal cycle setting circuit 20, and maintains internal row address strobe signal /RAS active for a predetermined period in accordance with external control signals (WCBR condition) applied in the set cycle.

In this state, since internal row address strobe signal /RAS is active, a word line is selected as will be described later in detail.

When the disturb mode setting cycle is completed, the self-disturb mode operation is then executed.

Start of the self-disturb mode is designated by so-called "CBR condition" under which external control signal /CAS (Ext./CAS) falls to the low level prior to falling of external control signal /RAS (Ext./RAS). In this state, external output enable signal /OE is set to the high level (VIH) at the voltage level in the normal operation, and the external write enable signal /W (Ext./W) is set to the high level. The voltage levels of high level signals /OE and /W can be set arbitrarily if such a structure is employed that operations of input buffer 15 and output buffer 16 are internally inhibited (i.e., column selection is inhibited) when the CBR condition is set. Control circuit 18 receives a disturb mode designating signal φDD from disturb mode control circuit 19. When the CBR condition is designated, control circuit 18 generates (activates) row selection operation activating signal φRAS in synchronization with signal (clock signal) CLK applied from internal cycle setting circuit 20.

When the CBR condition is designated, control circuit 18 sets address buffer 9 to the inactive (i.e., standby) state, and sets multiplexer 11 to the state for selecting internal address signal applied from internal address generating circuit 10. Internal address generating circuit 10 updates its internal address each time row selection activating signal φRAS applied from control circuit 18 is deactivated. Therefore, the address signal from internal address generating circuit 10 is renewed in synchronization with the clock signal issued from internal cycle setting circuit 20, and internal row selection operation activating signal (internal /RAS) φRAS is activated in synchronization with the clock signal applied from internal cycle setting circuit 20, so that the word line is set to the selected state in synchronization with the clock signal from internal cycle setting circuit 20 in memory array 7.

In memory array 7, the selected word line(s) may be one or more in number. The internal address signal and the word line selection operation activating signal are internally and automatically generated, and external control signal /RAS and external address signals A0–Ai do not affect the word line selection in semiconductor memory device 1. Therefore, the word line can be set fast to the selected state without being affected by delay in propagation of the external control signals and by a time required for toggle of external control signal /RAS. Upon each selection of word lines, gradual lowering of the potential occurs at electrode (storage node) of the capacitor of a defective memory cell among the memory cells storing data of the high level.

Owing to independent provision of the disturb mode set cycle and the cycle for actually performing the disturb test, the word line selection can be performed after the clock signal issued from internal cycle setting circuit 20 enters the stable state, and thus the word line can be accurately set to the selected state. The cycle of clock signal issued from internal cycle setting circuit 20 depends on the family (kinds) of the semiconductor memory device. It is required only that the clock signal is in the low level of the inactive state for a period satisfying a so-called RAS precharge time (i.e., time required for precharging row-selection-related circuits (RAS-related circuits), e.g., for bit line precharging and row decoder precharging into the state that all the word lines are nonselected). Here, "to issue the clock signal" means to issue a set of the high and low levels of the clock signal.

The particular operation mode detecting signal includes disturb mode setting instruction signal φDS applied from control circuit 18 to disturb mode control circuit 19, disturb mode designating signal φDD applied from disturb mode control circuit 19 to internal cycle setting circuit 20, and the disturb mode instruction signal issued under the CBR condition of the external control signals applied to control circuit 18 at the start of the disturb test.

The end of the disturb mode operation is designated by releasing the CBR condition. Thus, it is designated by setting both external control signals /RAS and /CAS to the high level. Thereby, control circuit 18 deactivates row selection operation activating signal φRAS when clock signal CLK applied from internal cycle setting circuit 20 is inactive. Thereby, the word line selecting operation is stopped. Internal cycle setting circuit 20 is still continuously generating clock signal CLK. In order to stop generation of clock signal CLK from internal cycle setting circuit 20, the rest cycle is executed.

In the reset cycle, (WCBR+super-Vcc) condition is designated again, and control circuit 18 issues the signal φDS to disturb mode control circuit 19 again. In response to the activated signal φDS applied from control circuit 18, disturb mode control circuit 19 takes in a particular address signal(s) among address signals A0–Ai applied to address signal input terminals 8, and thereby determines whether the address signals are in the predetermined states. When the address signal(s) thus taken is in the predetermined state, disturb mode control circuit 19 determines that reset of the disturb mode operation is designated, and sets the disturb mode designating signal φDD applied to internal cycle setting circuit 20 to the low level of the inactive state. In response to deactivation of the disturb mode designating signal from disturb mode control circuit 19, internal cycle setting circuit 20 is deactivated, so that generation (issuance) of clock signal CLK is stopped. In this reset cycle, selection of the word line may be carried out similarly to the set cycle. Specific structures of the respective circuits will now be described below.

Figure 3:
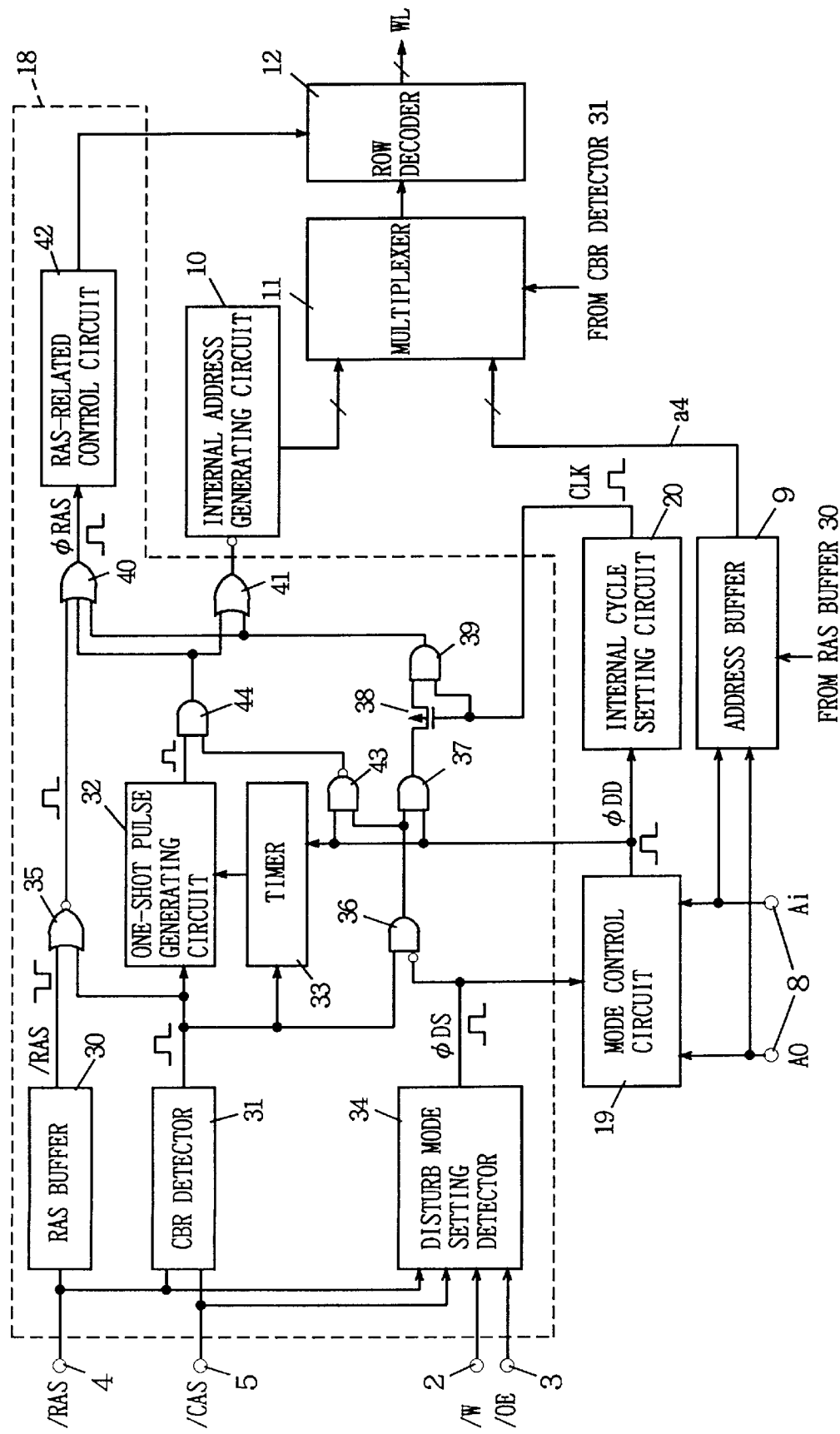
FIG. 3 shows a specific structure of a control circuit shown in FIG. 1.

FIG. 3 shows an example of a specific structure of control circuit 18 shown in FIG. 1. In FIG. 3, control circuit 18 includes an RAS buffer 30 which receives. external control signal /RAS (Ext./RAS) applied to external control signal input terminal 4 and outputs internal row address strobe signal /RAS, a CBR detector 31 which receives external control signals /RAS and /CAS applied to external control signal input terminals 4 and 5 to detect that the CBR condition is set, an one-shot pulse generating circuit 32 which generates a pulse signal of one shot in response to the CBR detection signal applied from CBR detector 31, a timer 33 which is activated in response to the CBR detection signal applied from CBR detector 31 to apply the activation signals to one-shot pulse generating circuit 32 at predetermined intervals while the CBR detection signal is active, and a disturb mode setting detector 34 which receives external control signals /W, /OE, /RAS and /CAS applied to external control signal input terminals 2–5, and outputs disturb mode setting signal φDS indicating that the disturb mode is set when these external control signals satisfy the (WCBR+ super-Vcc) condition.

One-shot pulse generating circuit 32 generates a pulse signal of one shot, which is active for a predetermined time, in response to activation of the CBR detection signal applied from CBR detector 31 and activation of the signal (refresh instruction signal) applied from timer 33. In the structure shown in FIG. 3, the one-shot pulse applied from one-shot pulse generating circuit 32 is active at the high level. Row address strobe signal /RAS applied from RAS buffer 30 is active at the low level.

The control circuit 18 further includes a two-input NOR gate 35 which receives row address strobe signal /RAS applied from RAS buffer 30 and the CBR detection signal applied from CBR detector 31, a two-input logic gate 36 which receives the CBR detection signal applied from CBR detector 31 and disturb mode setting instruction signal φDS applied from disturb mode setting detector 34, a two-input AND gate 37 which receives an output signal of logic gate 36 and disturb mode designating signal φDD applied from mode control circuit 19, a transfer gate 38 which selectively passes therethrough an output signal of AND gate 37 in response to clock signal CLK from internal cycle setting circuit 20, a two-input AND gate 39 which receives clock signal CLK applied from internal cycle setting circuit 20 and an output signal of transfer gate 38, a 2-input NAND gate 43 which receives the signal φDD and the output signal of logic gate 36, a 2-input AND gate 44 which receives an output signal of NAND gate 43 and an output signal of one-shot pulse generating circuit 32, a 3-input OR gate 40 which receives an output signal of NOR gate 35 and output signals of gates 39 and 44, a two-input OR gate 41 which receives an output signal of AND gate 44 and an output signal of AND gate 39, and an RAS-related control circuit 42 which activates circuits related to row selection at predetermined timings in response to an output signal φRAS from OR gate 40. In FIG. 3, RAS-related control circuit 42 is shown to control activation/deactivation of row decoder 12, as an example.

Signals applied from respective circuits have waveforms shown in FIG. 3 when activated. NOR gate 35 outputs the signal at the high level when signal /RAS applied from RAS buffer 30 is at the low level and the output signal of CBR detector 31 is at the low level. Thus, in the normal operation (i.e., when the CBR condition is not set), NOR gate 35 inverts the signal applied from RAS buffer 30 for outputting. When the CBR condition is set, the output signal of NOR gate 35 is set to the low level of the inactive state regardless of the logical level of the output signal of RAS buffer 30. Thereby, the row selecting operation controlled by external control signal /RAS (Ext./RAS) is inhibited when the CBR condition is set. Gate circuit 36 outputs the active signal at the high level when CBR detection signal applied from CBR detector 31 is at the high level of the active state and disturb mode setting instruction signal φDS applied from disturb mode setting detector 34 is at the low level of the inactive state. Thus, gate 36 outputs the active signal at the high level only when self-disturb operation mode is designated and the word lines are successively selected.

AND gate 37 outputs the signal at the high level when the output signal of gate 36 and disturb mode designating signal φDD applied from mode control circuit 19 are both at the high level. Transfer gate 38 is formed of, e.g., a p-channel MOS transistor, and is made conductive when clock signal CLK applied from internal cycle setting circuit 20 is at the low level. Therefore, even if clock signal CLK is at the high level when termination of the self-disturb mode is designated, clock signal φRAS is prevented from falling to the low level immediately after the designation. After clock signal CLK falls to the low level, the self-disturb operation is terminated. It becomes possible to prevent destruction of memory cell data due to incomplete selection of the word line (i.e., such a state that the word line selection period is short, and the word line is deselected prior to complete sense operation and complete disturb operation). Transfer gate 38, therefore, has a function of a latch circuit which latches the output signal of AND gate 37 each time clock signal CLK rises.

OR gate 40 outputs word line selection operation activating signal (internal RAS signal) φRAS which attains the active state at the high level when any one of output signals of AND gate 39, AND gate 44 and NOR gate 35 attains the high level. Signal φRAS is applied to RAS-related control circuit 42. In FIG. 3, RAS-related control circuit 42 is shown to control only row decoder 12. However, it also controls operation of other circuits such as sense amplifier circuit and bit line equalize/precharge circuit.

Figure 4:
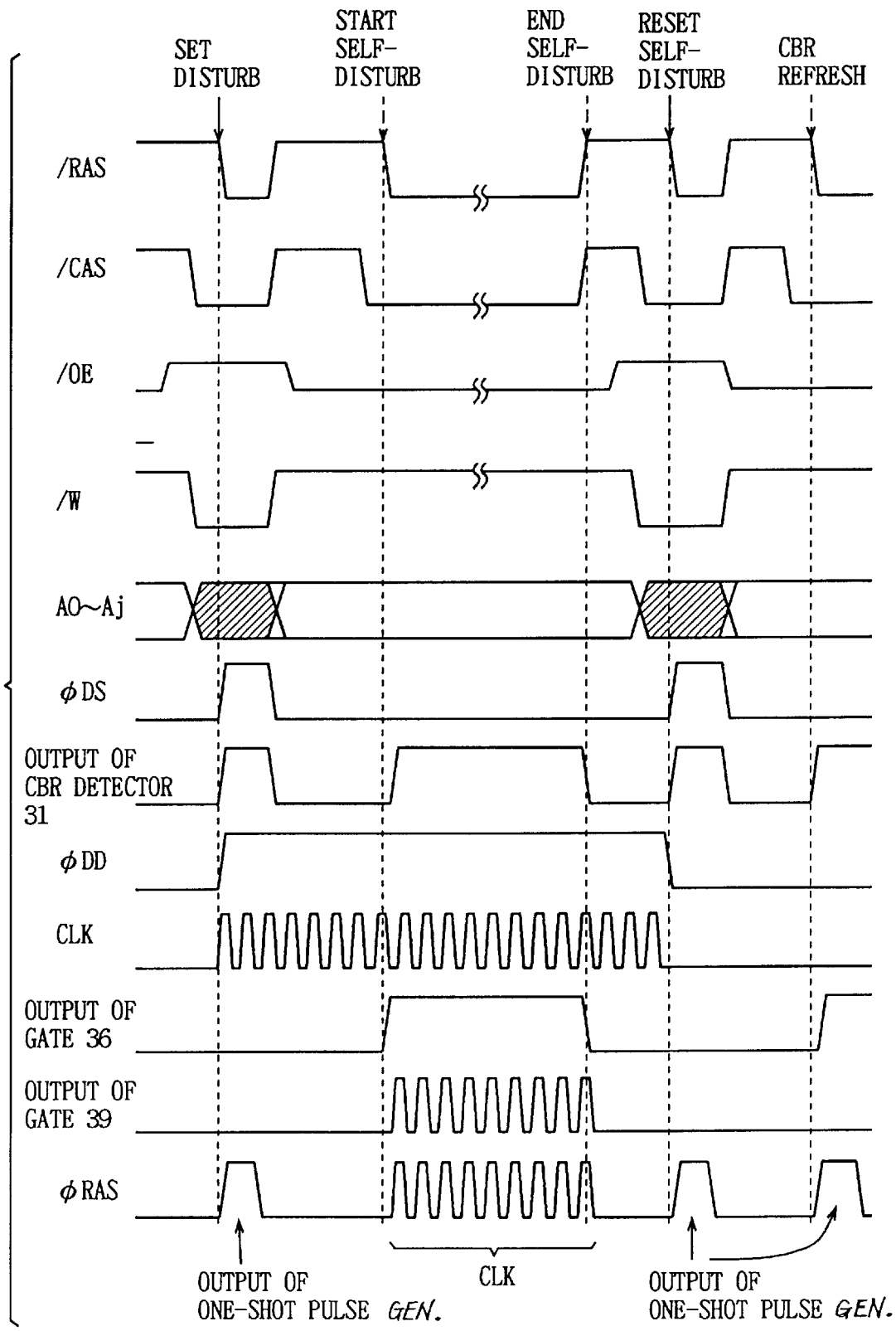
FIG. 4 is a signal waveform diagram representing operation of the control circuit shown in FIG. 3.

An output signal of OR gate 41 is applied to internal address generating circuit 10. Internal address generating circuit 10, which outputs the address signal, increments or decrements the address value indicated by the address signal each time the output signal of OR circuit 41 falls. Now, operation of the control circuit shown in FIG. 3 will be described below with reference to FIG. 4 showing its operation waveforms.

In the disturb mode set cycle, the (WCBR+super-Vcc) condition and address key condition are satisfied. The address key condition indicates the condition that a particular address signal is set to a predetermined state. In this state, the output signal of CBR detector 31 attains the high level of the active state, and output signal φDS of disturb mode setting detector 34 attains the high level of the active state. This signal φDS brings the output signal of gate 36 to the low level. Thereby, the output signal of gate 37 attains the low level, and responsively the output signal of gate 39 attains the low level. Meanwhile, in response to signal φDS at the high level, disturb mode designating signal φDD issued from mode control circuit 19 rises to the high level, so that internal cycle setting circuit 20 is activated to generate clock signal CLK having a predetermined cycle. At this time, gate 39 receives at one input thereof the signal at the low level from gate 37, so that the output signal of gate 39 maintains the low level regardless of the logical state of clock signal CLK. Meanwhile, gate 43 receiving the signal at the low level from gate 36 outputs the signal at the high level. Thereby, gate 44 passes therethrough the output signal of one-shot pulse generating circuit 32.

One-shot pulse generating circuit 32 outputs a pulse signal having a predetermined time width in response to rising of the signal applied from CBR detector 31. The output signal of gate 35 is fixed at the low level owing to the signal from CBR detector 31. Thereby, gate 40 passes the one-shot pulse signal therethrough, which is applied through gate 44 from one-shot pulse generating circuit 32, as word line selection operation activating signal (internal RAS signal) φRAS. RAS-related control circuit 42 outputs control signals required for word line selection in response to signal φRAS. In accordance with the output signal from CBR detector 31, multiplexer 11 is set to the state for transmitting the internal address generated by internal address generating circuit 10. Thereby, in the disturb mode setting cycle, the word line selection is executed in accordance with the internal address signal generated from internal address generating circuit 10. When signal φRAS is set to the low level of the inactive state, the address value of address signal generated from internal address generating circuit 10 is incremented or decremented by one.

In this disturb mode set cycle, when (WCBR+super-Vcc) condition is released, the output signal of CBR detector 31 is set to the low level of the inactive state, and disturb mode setting instruction signal φDS applied from disturb mode setting detector 34 is also set to the low level of the inactive state. Disturb mode designating signal φDD applied from mode control circuit 19 maintains the high level of the active state, and internal cycle setting circuit 20 continuously outputs clock signal CLK.

When start of the self-disturb operation is instructed by the CBR condition, the output signal of CBR detector 31 attains the high level of the active state. Thereby, gate 36 passes the output signal of CBR detector 31 therethrough (signal φDS is at the low level), so that gate 37 is enabled, and thus the output signal of gate 37 attains the high level. When clock signal CLK attains the low level, transfer gate 38 is turned on and AND gate 39 is enabled, so that clock signal CLK applied from internal cycle setting circuit 20 passes through gate 39, and OR gate 40 generates signal φRAS synchronized with clock signal CLK. At this time, one-shot pulse generating circuit 32 generates a pulse of one shot in response to rising of the output signal of CBR detector 31. However, gate 43 receives on its both inputs the signals at the high level, and outputs the signal at the low level to disable gate 44 for inhibiting transmission of the one-shot pulse applied from one-shot pulse generating circuit 32.

When the disturb test ends, both signals /RAS and /CAS are deactivated and attains the high level. Thereby, the output signal of CBR detector 31 is deactivated and attains the low level. Responsively, the output signal of gate 36 attains the low level, and the output signal of gate 37 attains the low level. When clock signal CLK is at the high level, transfer gate 38 is off, and disabling of gate 39 by the output signal of gate 37 is delayed until clock signal CLK falls to the low level. When clock signal CLK falls to the low level, transfer gate 38 is turned on, and the output signal of gate 37 at the low level disables gate 39, so that transmission of clock signal CLK is inhibited, and the output signal of gate 39 attains the low level. Meanwhile, gate 43 outputs the signal at the high level to enable gate 44, because the output signal of gate 36 attains the low level.

In the disturb test reset cycle, condition of (WCBR+super-Vcc+address key) is set. Combination of states of the address signals applied in this reset cycle is different from the address key (combination of the predetermined states of address signals) applied in the disturb test cycle. Again, disturb mode setting detector 34 outputs active signal φDS under the (WCBR+super-Vcc) condition. Mode control circuit 19 is activated by this activated signal φDS, and the address key applied at this time sets signal φDD to the low level of the inactive state. This inhibits the clock signal generating operation of internal cycle setting circuit 20. Since signal φDS is at the high level, gate 36 outputs the signal at the low level. Thereby, the output signal of gate 43 attains the high level, and gate 44 is enabled. One-shot pulse generating circuit 32 generates a pulse signal of one shot in accordance with the output signal from CBR detector 31. The pulse signal of one shot is transmitted to gate 40 through gate 44, and signal φRAS having a predetermined time width is generated.

In the operation of refreshing memory cell data, the CBR condition is satisfied. In this state, output signal φDS of disturb mode setting detector 34 and output signal φDD of mode control circuit 19 both are at the low level of the inactive state. Gate 37 is disabled, and gates 43 and 44 are enabled. Therefore, one-shot pulse generating circuit 32 outputs the pulse signal of one shot in accordance with the output signal of CBR detector 31, and activates word line selection operation activating signal (internal RAS signal) φRAS via gates 44 and 40.

In accordance with the output signal of CBR detector 31, timer 33 is activated, and outputs a refresh request signal at a predetermined time interval, so that one-shot pulse generating circuit 32 generates the one-shot pulse in accordance with the refresh request signal applied from timer 33. Thereby, refresh of memory cell data is executed at predetermined intervals while the output signal of CBR detector 31 is at the high level of the active state. Time-counting operation of timer 33 is inhibited by signal φDD during the disturb test operation.

Figure 5:
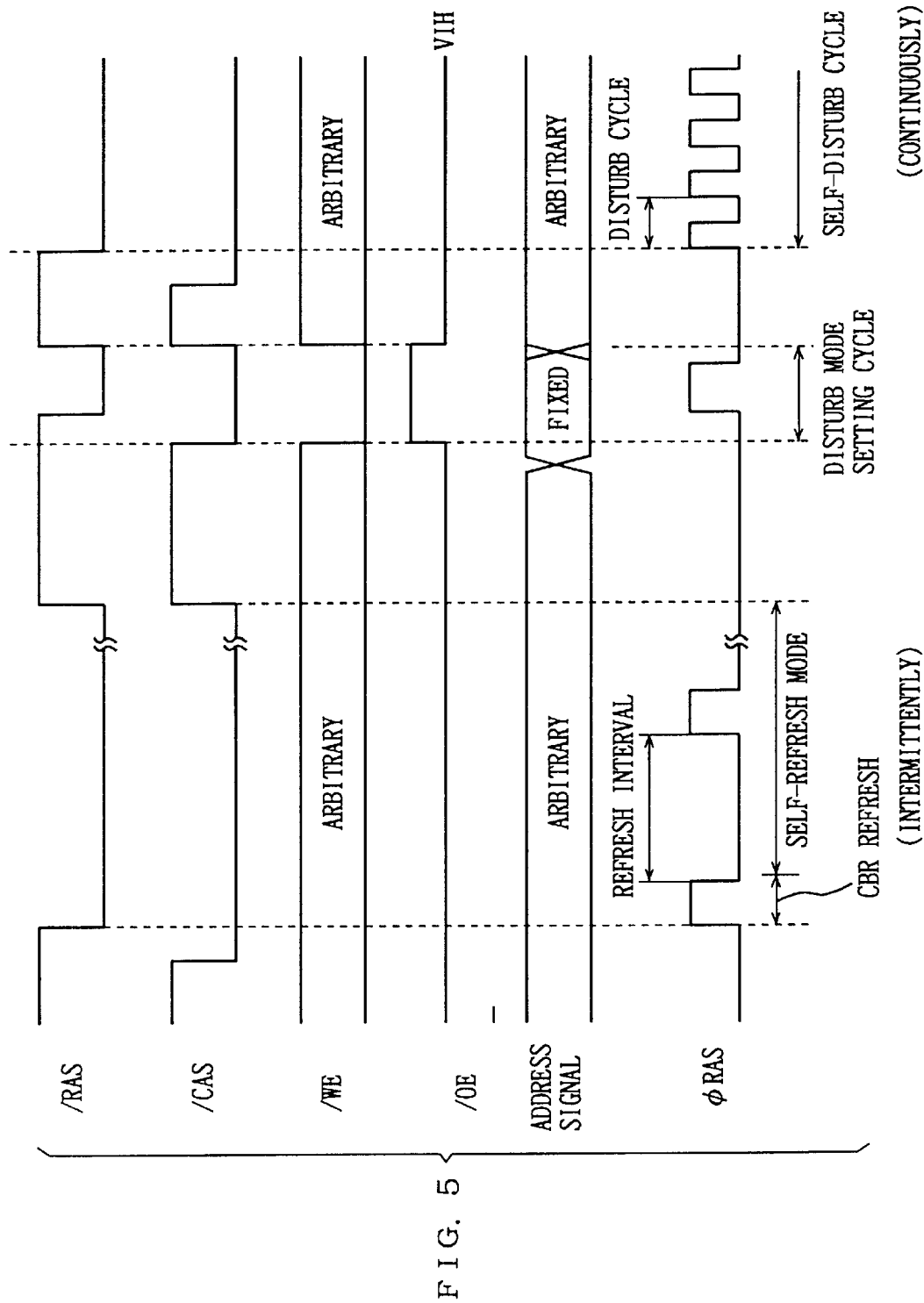
FIG. 5 shows a manner of generation of a clock signal in a test operation mode and a self-refresh mode according to the invention.

Thus, as shown in FIG. 5, internal RAS signal φRAS is generated at predetermined time intervals under the control of CBR detector 31, one-shot pulse generating circuit 32 and timer 33 in the self-refresh mode. During this self-refresh mode, internal RAS signal φRAS is intermittently activated (generated) at the predetermined time intervals.

In the cycle for performing the disturb test, mode control circuit 19 and internal cycle setting circuit 20 is repetitively and continuously activated with a short cycle at no interval, and correspondingly internal RAS signal φRAS is repetitively and continuously activated at a short period. Here, the word "intermittently" is used to express the state that time counting is performed, e.g., with a timer, and the signal is generated (activated) at certain time intervals. The word "continuously" is used to express the state that time counting, e.g., with a timer is not performed, and the signal having a certain cycle is repetitively generated, e.g., with an oscillator.

Thus, selection of the word lines in the disturb test mode is performed at a cycle significantly shorter than that of the self-refresh.

Figure 6:
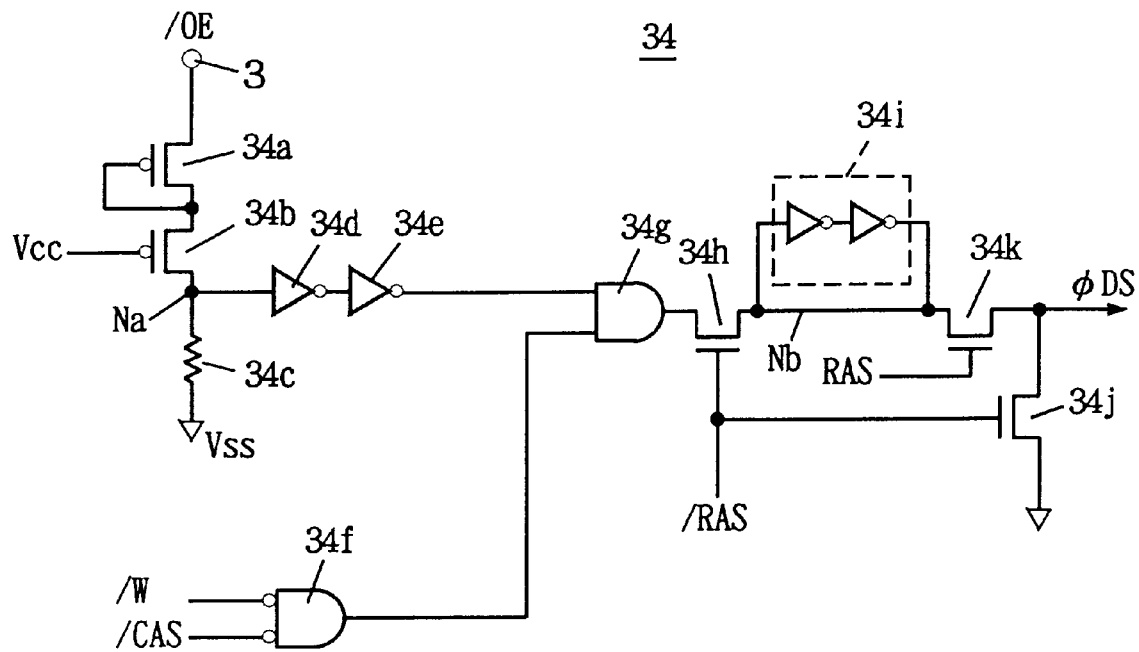
FIG. 6 shows an example of a structure of a disturb mode setting detector shown in FIG. 3.

FIG. 6 shows a specific structure of disturb mode setting detector 34 shown in FIG. 3. In FIG. 6, disturb mode setting detector 34 includes p-channel MOS transistors 34a and 34b connected in series between external control signal input terminal 3 and a node Na, and a resistance element 34c of a high resistance connected between node Na and ground node Vss. MOS transistor 34a has a source connected to external control signal input terminal 3 as well as a gate and a drain connected together. MOS transistor 34b has a source connected to the gate and drain of MOS transistor 34a, a gate receiving operation power supply voltage Vcc and a drain connected to node Na. MOS transistors 34a and 34b have sufficiently large current driving capabilities.

Figure 7:
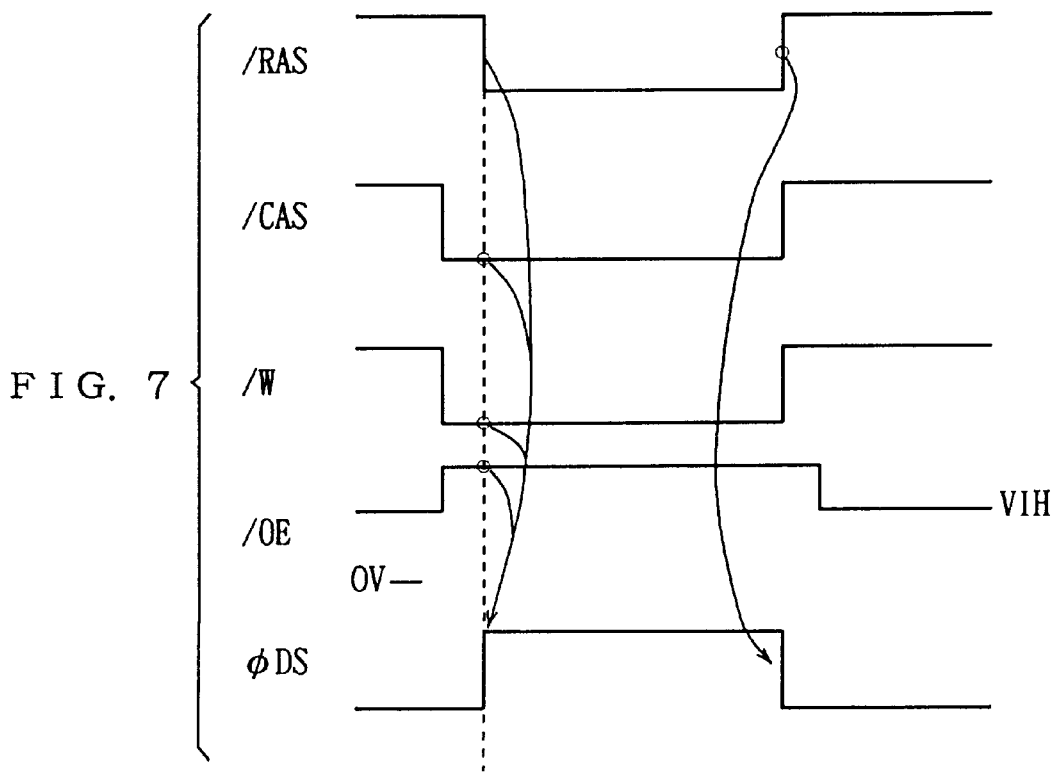
FIG. 7 is a waveform diagram representing operation of the disturb mode setting detector shown in FIG. 6.

Disturb mode setting detector 34 further includes two cascaded inverters 34d and 34e for amplifying a signal potential on node Na, a gate circuit 34f receiving control signals /W and /CAS, a gate circuit 34g receiving an output signal of inverter 34e and an output signal of gate circuit 34f, a transfer gate 34h which is responsive to control signal /RAS to transmit an output signal of gate circuit 34g to a node Nb, a latch circuit 34i which is provided for latching a signal potential on node Nb and is formed of two cascaded inverters, a transfer gate 34j which is responsive to control signal /RAS to discharge the signal φDS to the ground potential level, and a transfer gate 34k which is responsive to signal RAS to output a signal on a node Nb as signal φDS. Gate circuit 34f outputs the signal at the high level when both signals /W and /CAS are at the low level. Gate circuit 34g outputs the signal at the high level when both the output signals of inverter circuit 34e and gate circuit 34f are at the high level. Transfer gates 34h and 34j are formed of n-channel MOS transistors and are turned on when signal /RAS attains the high level. Transfer gate 34k is formed of, e.g., an n-channel MOS transistor, and is turned on when signal RAS attains the high level. Control signals /W, /CAS and /RAS may be output signals of buffer circuits (not shown), or may be signals to be applied to external control signal input terminals. Then, operation of disturb mode setting detector 34 will be described below with reference to an operation waveform diagram of FIG. 7.

In operation modes other than the mode related to the set/reset of the disturb test operation, i.e., in operations such as the self-disturb test operation, self-refresh operation and memory access operation, control signal /OE applied to external control signal input terminal 3 is at the low level or at the high level (VIH) determined by the specification value. MOS transistor 34b is turned on when the potential of the source thereof (i.e., node connected to transistor 34a) is equal to or greater than (Vcc+Vthp). When turned on, MOS transistor 34a lowers the signal potential applied to external control signal input terminal 3 by a value equal to threshold voltage Vthp for transmission to the source of MOS transistor 34b. Therefore, both MOS transistors 34a and 34b are turned on when the voltage level applied to external control signal input terminal 3 increases to or exceeds (Vcc+2·Vthp).

When the voltage level of external control signal /OE is not higher than the normal high level VIH, MOS transistor 34b is off and a current does not flow through resistance 34c, so that node Na is maintained at the ground potential level. Therefore, regardless of the logical level of output signal of gate circuit 34f, the output signal of gate circuit 34g maintains the low level, and, even if signal /RAS is toggled, disturb mode setting instruction signal φDS maintains the low level. Meanwhile, when signal /OE applied to external control signal input terminal 3 is set to the level not lower than the predetermined level (Vcc+2·Vthp), both transistors 34a and 34b are turned on, and a current flows through resistance 34c. The current drive capabilities of transistors 34a and 34b are sufficiently large, and on-resistances thereof are sufficiently smaller than the resistance value of resistance element 34c. A minute current flows through resistance element 34c, so that the potential of node Na rises to the high level (Vcc level) and is amplified (or buffered) by inverters 34d and 34e and then applied to gate circuit 34g. Since both signals /W and /CAS are at the low level, the output signal of gate circuit 34f attains the high level, and gate circuit 34g outputs the signal at the high level. When signal /RAS is at the high level, transfer gate 34h is on, and the output signal of gate circuit 34g is transmitted to node Nb and is latched by latch circuit 34i. Signal RAS is complementary to signal /RAS. In this state, transfer gate 34k is off. Signal φDS is maintained at the low level, because transfer gate 34j is on.

When signal /RAS falls to the low level, transfer gate 34h is turned off, and the output of gate circuit 34g is isolated from node Nb. Also, transfer gate 34j is off. At this time, signal RAS attains the high level, transfer gate 34k is turned on, and signal φDS rises to the high level.

When signal /RAS rises to the high level, and the disturb mode set cycle is completed, transfer gate 34h is turned on, and transfer gate 34k is turned off. Thereby, transmission of the signal potential of node Nb is inhibited. Transfer gate 34j is turned on by signal /RAS, and disturb mode setting instruction signal φDS attains the low level.

Also in the disturb mode reset cycle, the (WCBR+super-Vcc) condition is satisfied, so that signal φDS changes in accordance with control signal /RAS.

MOS transistor 34a may be implemented by a plurality of MOS transistors connected in series for detecting the super-Vcc condition.

Figure 8:
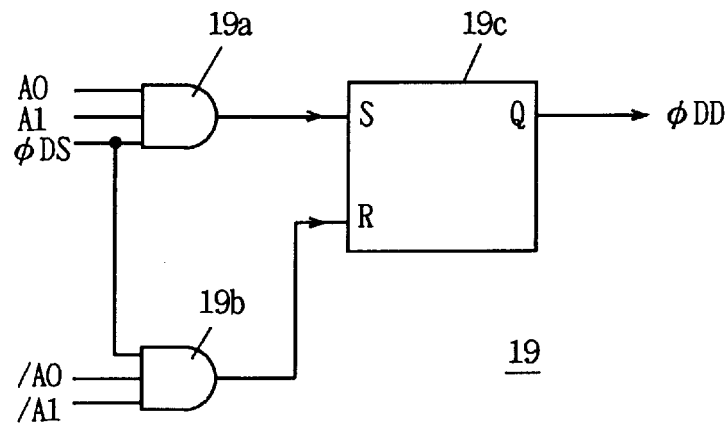
FIG. 8 shows an example of a structure of a mode control circuit shown in FIG. 3.

FIG. 8 shows an example of a structure of mode control circuit 19 shown in FIG. 3. In FIG. 8, there is illustrated the structure in which set and reset of the disturb mode are made using address signals A0 and A1 of two bits. However, the number of bits of address signals may be arbitrarily determined.

Figure 9:
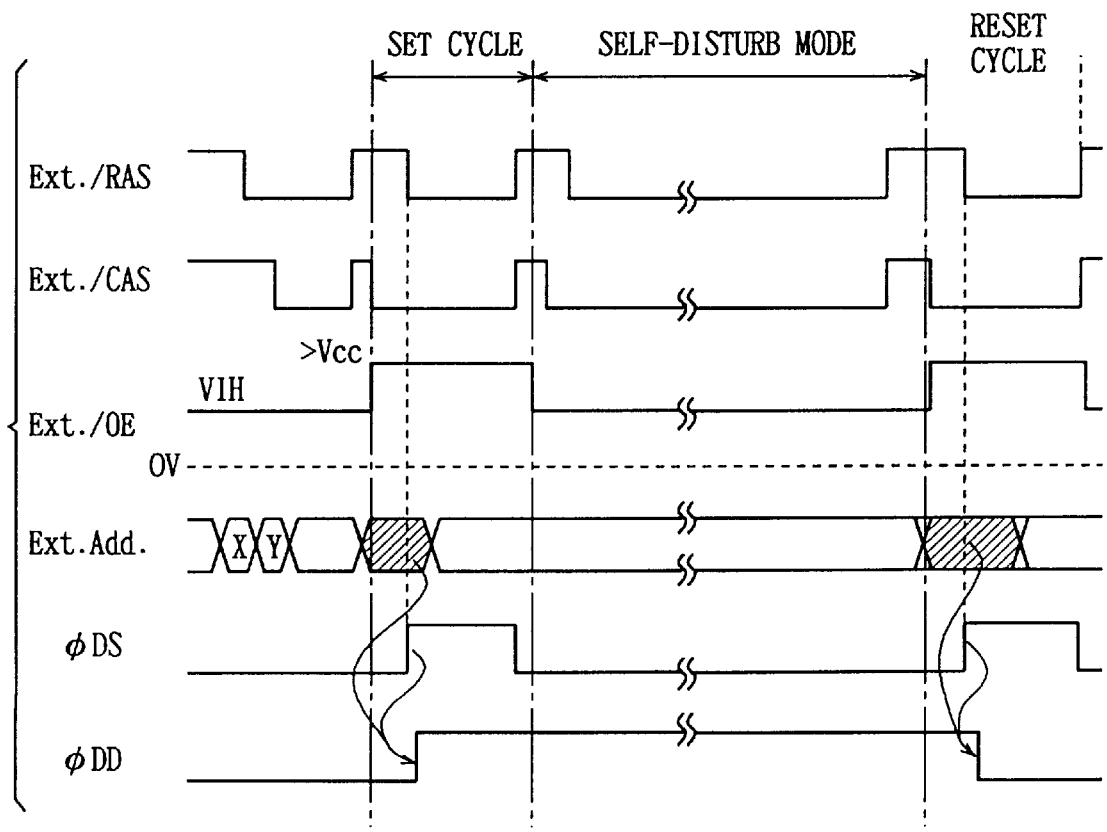
FIG. 9 is a signal waveform diagram representing operation of the mode control circuit shown in FIG. 8.

In FIG. 8, mode control circuit 19 includes a gate circuit 19a receiving disturb mode setting instruction signal φDS and address signals A0 and A1, a gate circuit 19b receiving signal φDS and address signals /A0 and /A1, and a set/reset flip-flop 19c which receives at a set input S an output signal of gate circuit 19a and receives at a reset input R an output signal of gate circuit 19b. Disturb mode designating signal φDD is output from an output Q of flip-flop 19c. Address signals /A0 and /A1 are complementary to address signals A0 and A1, respectively. Gate circuits 19a and 19b each output the signal at the high level when all the received input signals are at the high level. Now, operation of mode control circuit 19 shown in FIG. 8 will be described below with reference to an operation waveform diagram of FIG. 9.

In the disturb mode set cycle, when (WCBR+super-vcc) condition is satisfied, disturb mode setting instruction signal φDS issued from disturb mode setting detector 34 attains the high level, and gate circuits 19a and 19b are enabled. In the set cycle, when both address signals A0 and A1 attain the high level, the output signal of gate circuit 19a rises to the high level, flip-flop 19c is set, and disturb mode setting signal φDD applied from output Q rises to the high level. Even when set cycle is completed and disturb mode setting instruction signal φDS falls to the low level, signal φDD applied from flip-flop 19c maintains the high level.

When the self-disturb mode is terminated and the disturb mode is reset, (WCBR+super-Vcc) condition is satisfied, and signal φDS applied from disturb mode setting detector 34 rises to the high level. In this operation, when both address signals A0 and A1 are set to the low level, and thus both address signals /A0 and /A1 are set to the high level, the output signal of gate circuit 19b rises to the high level, flip-flop 19c is reset, and signal φDD falls to the low level.

Figure 10:
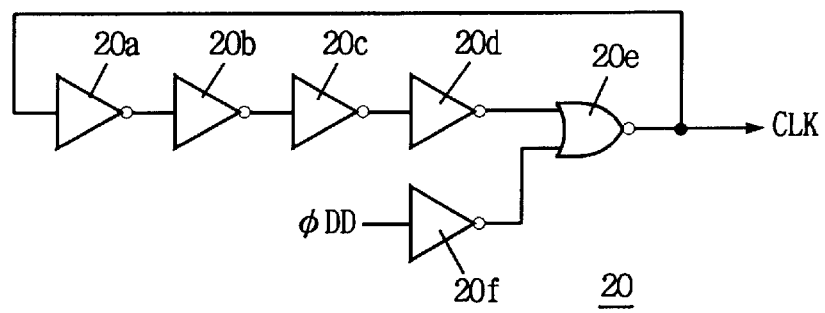
FIG. 10 shows an example of a structure of an internal cycle setting circuit shown in FIG. 3.

FIG. 10 shows an example of a structure of internal cycle setting circuit 20 shown in FIG. 3. In FIG. 10, internal cycle setting circuit 20 includes a plurality of (four in FIG. 10) cascaded inverters 20a–20d, and an NOR gate 20e receiving an output signal of inverter 20d and disturb mode instruction signal φDD through an inverter 20f. The number of inverters 20a–20d may be appropriately determined depending on the frequency or cycle of clock signal CLK to be generated. Operation of internal cycle setting circuit 20 shown in FIG. 10 will now be described below with reference to a timing chart of FIG. 11.

When disturb mode instruction signal φDD is at the low level, the output signal of inverter 20f is at the high level, and the output signal of NOR gate 20e is fixed at the low level. In this state, output signals of inverters 20a, 20b, 20c and 20e are fixed at the high level, low level, high level and low level, respectively.

Figure 11:
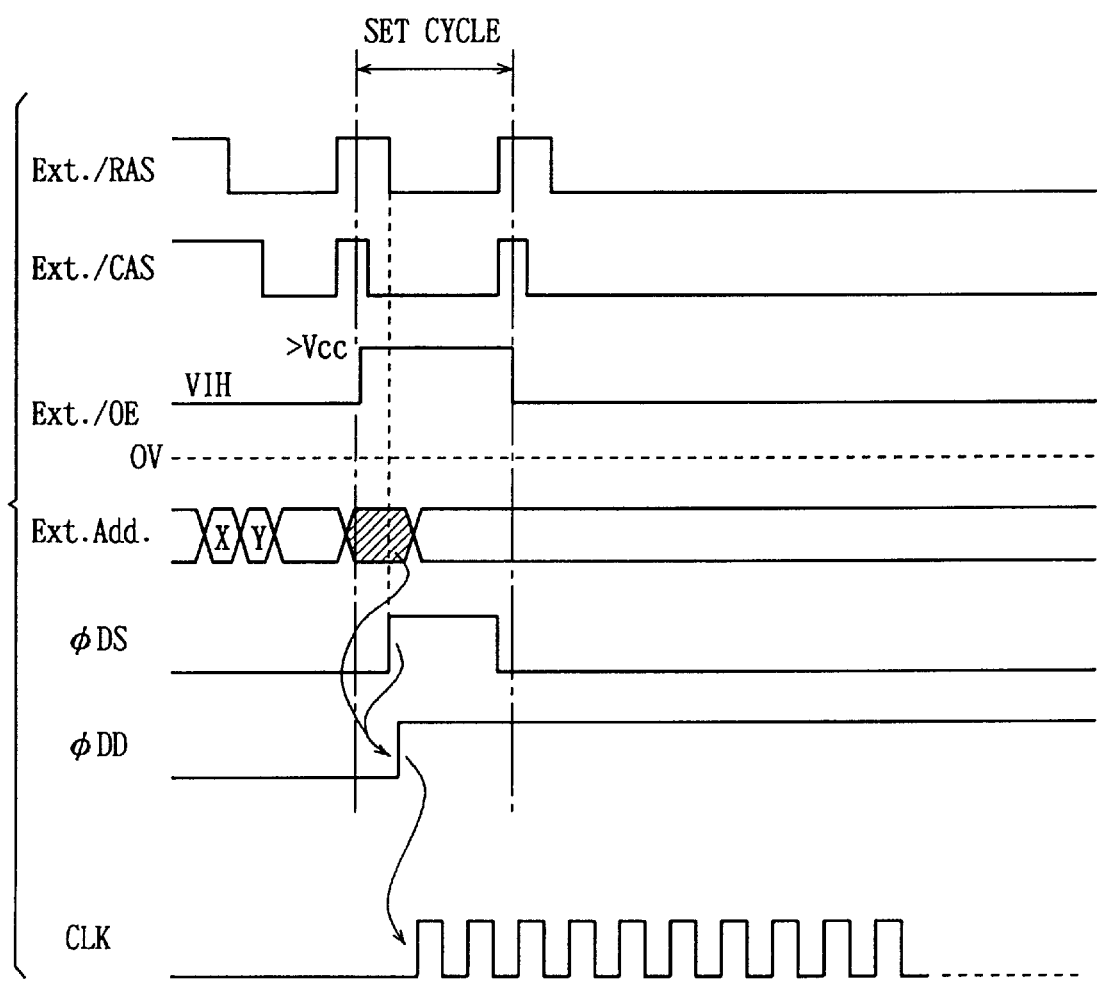
FIG. 11 is a signal waveform diagram representing operation of the internal cycle setting circuit shown in FIG. 10.

When (WCBR+super-Vcc) condition is satisfied (FIG. 11 representatively shows the disturb mode set cycle), signal φDD rises to the high level, and the output signal of inverter 20f attains the low level. Responsively, NOR gate 20e receives on its both inputs the signals at the low level, so that clock signal CLK applied from NOR gate 20e rises to the high level. In response to the rising of clock signal CLK to the high level, logical level of the output signals of inverters 20a–20d change with a certain time delay. NOR gate 20e receives the signal fixed at the low level through inverter 20f, and functions as an inverter. Therefore, inverters 20a–20d and NOR gate 20e function as a ring oscillator formed of five stages of cascaded inverters, and continuously issue clock signal CLK with a predetermined cycle. In the reset cycle, disturb mode designating signal φDD falls to the low level owing to the combination of the (WCBR+super-Vcc) condition and the address key, and the output signal of inverter 20f rises to the high level. Thereby, clock signal CLK issued from NOR gate 20e is fixed at the low level, and generation (activation) of clock signal CLK stops.

Internal address generating circuit 10 shown in FIG. 3 has the same structure as the refresh address counter generating the refresh address used for refreshing of memory cell data, and it can be used as the refresh address counter. The count of the address of internal address generating circuit 10 is incremented or decremented by one in accordance with falling of the output signal of OR gate 41 (see FIG. 3).

As described above, the first embodiment of the invention is constructed such that the word line is selected by internally and continuously generating row selection operation activating signal φRAS in the particular operation mode such as disturb test operation, so that the semiconductor memory device can internally perform the word line selection independently from external control signals, and thus the word lines can be successively and rapidly selected.

[Second Embodiment]

Figure 12:
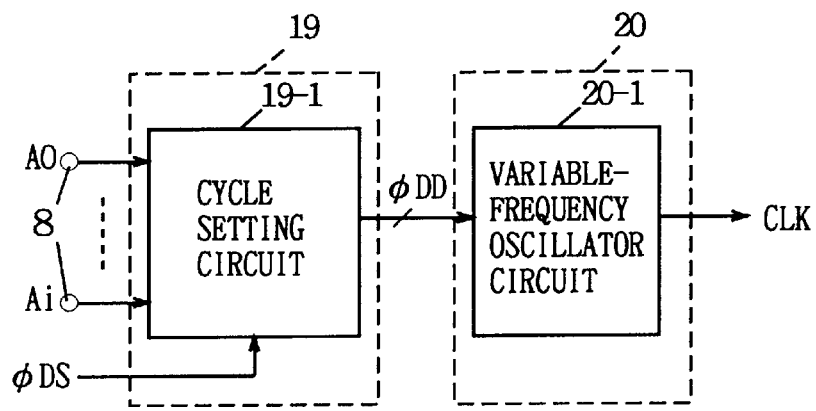
FIG. 12 shows a second embodiment of the invention, and in particular shows a structure of a main portion of a semiconductor memory device.

FIG. 12 shows a second embodiment of the invention, and particularly shows a structure of a main portion of the semiconductor memory device. In FIG. 12, structures of mode control circuit 19 and internal cycle setting circuit 20 are representatively shown. Other structures are the same as those shown in FIG. 3. Mode control circuit 19 is activated upon activation of disturb mode setting instruction signal φDS issued from disturb mode setting detector 34. When activated, mode control circuit 19 takes in address signals A0–Ai applied to address signal input terminals 8, selects the period of clock signal CLK to be generated in accordance with the value of address signals, and activates disturb mode designating signal φDD. Since mode control circuit 19 has a period setting function, mode control circuit 19 is shown as a cycle setting circuit 19-1 in FIG. 12. Signal φDD issued from cycle setting circuit 19-1, therefore, includes information designating the frequency or period of clock signal CLK and information indicating that the disturb mode is designated.

Internal cycle setting circuit 20 is formed of a variable-frequency oscillator circuit 20-1 capable of changing the cycle of clock signal CLK. Variable-frequency oscillator circuit 20-1 generates the clock signal having a period specified in accordance with signal φDD applied from cycle setting circuit 19-1. The signal φDD is formed of a plurality of bits in the second embodiment as will be described later.

The following advantages can be achieved by changing the frequency (period) of clock signal CLK. If the disturb test operation period is constant, the number of times of word line selection (i.e., the number of times of disturb) can be changed by changing the frequency or period of clock signal CLK. Thus, the number of times of disturb can be easily changed in accordance with the operation conditions of the semiconductor memory device. For example, the upper and lower limits exist in the range of permissible value of the operation power supply voltage. With the upper and lower limit values of the operation power supply voltage, the semiconductor memory device attains different internal states, and more specifically differences occur in the amplitude of the potential of word line, the amplitude of the potential of bit line and the quantity of floating up potential caused by capacitive coupling of the word lines. Therefore, by changing the number of times of disturb in accordance with these operation conditions, it is possible to determine whether data can be reliably held even at the time of change in the operation conditions or not, and the test can be executed more precisely.

A semiconductor memory device of a different type (family) may have different characteristics such as an operation speed. In this case, a different time may be required from activation of internal RAS signal φRAS to completion of the sensing operation and disturb operation. Therefore, by changing the period of clock signal in accordance with the type (family) of the semiconductor memory device, test conditions according to the characteristics and performance such as an operation speed can be set for a plurality of semiconductor memory device of different families.

Figure 13:
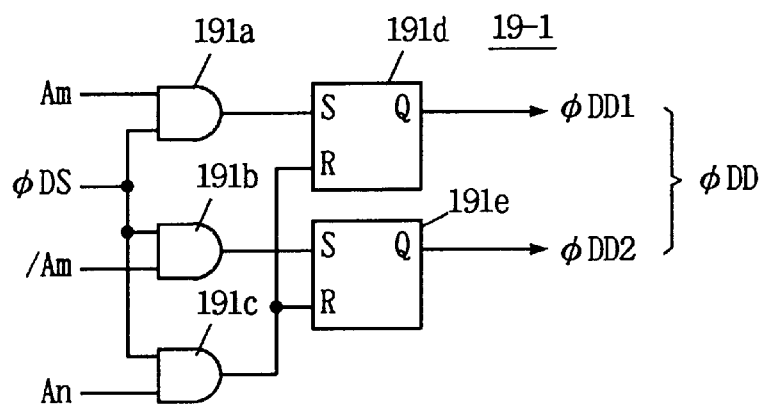
FIG. 13 shows an example of a structure of a cycle setting circuit shown in FIG. 12.

FIG. 13 shows an example of a structure of cycle setting circuit 19-1 shown in FIG. 12. In FIG. 13, there is shown a structure for setting two frequencies or periods of the clock signal.

In FIG. 13, cycle setting circuit 19-1 includes a gate circuit 191a receiving an address signal Am and disturb mode setting instruction signal φDS, a gate circuit 191b receiving an address signal /Am and the signal φDS, and a gate circuit 191c receiving the signal φDS and an address signal An. Address signals Am and /Am are complementary with each other, and address signal An is different in digit from these address signals.

Cycle setting circuit 19-1 further includes a set/reset flip-flop 191d which is set in response to an output signal of gate circuit 191a to output a first disturb mode designating signal φDD1, and a set/reset flip-flop 191e which is set in response to an output signal of gate circuit 191b to output a second disturb mode designating signal φDD2. Flip-flops 191d and 191e are reset in response to an output signal of gate circuit 191c. Operation of cycle setting circuit 19-1 shown in FIG. 13 will be described below with reference to an operation waveform diagram of FIG. 14.

Figure 14:
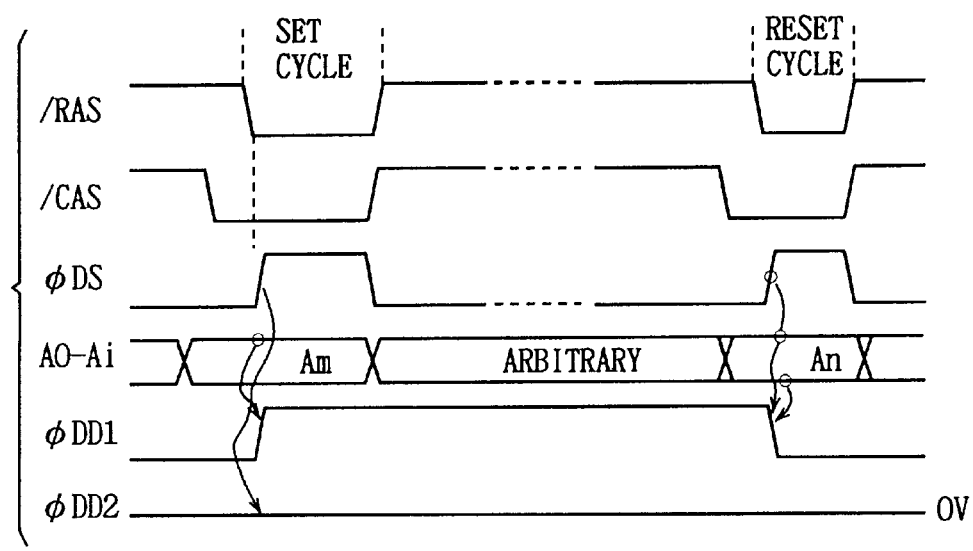
FIG. 14 is a signal waveform diagram representing operation of the cycle setting circuit shown in FIG. 13.

In the disturb mode set cycle, when predetermined (WCBR+super-Vcc) condition is satisfied (only signals /RAS and /CAS are shown in FIG. 14), disturb mode setting instruction signal φDS applied from disturb mode setting detector 34 shown in FIG. 3 is activated to attain the high level. If address signal Am is at the high level, the output signal of gate circuit 191a rises to the high level, and flip-flop 191d is set, so that first disturb mode designating signal φDD1 is activated to attain the high level. With the period designated by the first disturb mode designating signal φDD1 thus activated, variable-frequency oscillator circuit 20-1 shown in FIG. 12 performs oscillation to issue continuously clock signal CLK having the designated period (frequency). In the disturb mode reset cycle, if (WCBR+super-Vcc) condition is satisfied and currently applied address signal An is at the high level, the output signal of gate circuit 191c attains the high level, so that flip-flops 191d and 191e are reset, and first disturb mode designating signal φDD1 is deactivated to attain the low level. Thereby, oscillation of variable-frequency oscillator circuit 20-1 (see FIG. 12) stops.

The structure shown in FIG. 13 is adapted to use the address signal of one bit for selecting one of the two clock signal frequencies (periods). However, such a structure may be employed that one clock signal is selected from three or more clock signal frequencies (periods) by decoding the address signal of multiple bits. Similar structure can be employed for address signal An resetting the flip-flops.

Figure 15:
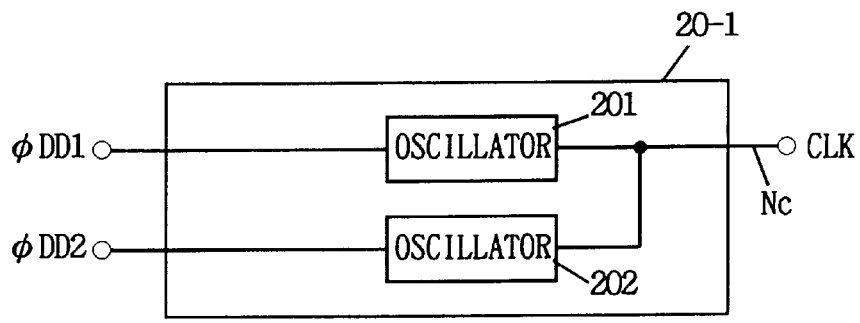
FIG. 15 schematically shows a structure of a variable-frequency oscillator circuit shown in FIG. 12.

FIG. 15 shows an example of a structure of variable-frequency oscillator circuit 20-1 shown in FIG. 12. Also in FIG. 15, there is shown a structure for selecting the clock signal having one of two frequencies (periods).

In FIG. 15, variable-frequency oscillator circuit 20-1 includes an oscillator 201 which is activated to generate the clock signal having a first period upon activation of first disturb mode designating signal φDD1 applied from cycle setting circuit 19-1, and an oscillator 202 which is activated to output the clock signal having a second period upon activation of second disturb mode designating signal φDD2. Outputs of oscillators 201 and 202 are connected together. Owing to the structure including two oscillators 201 and 202 having different oscillating frequencies which are selectively activated, the clock signal having an intended period can be easily generated.

Figure 16:
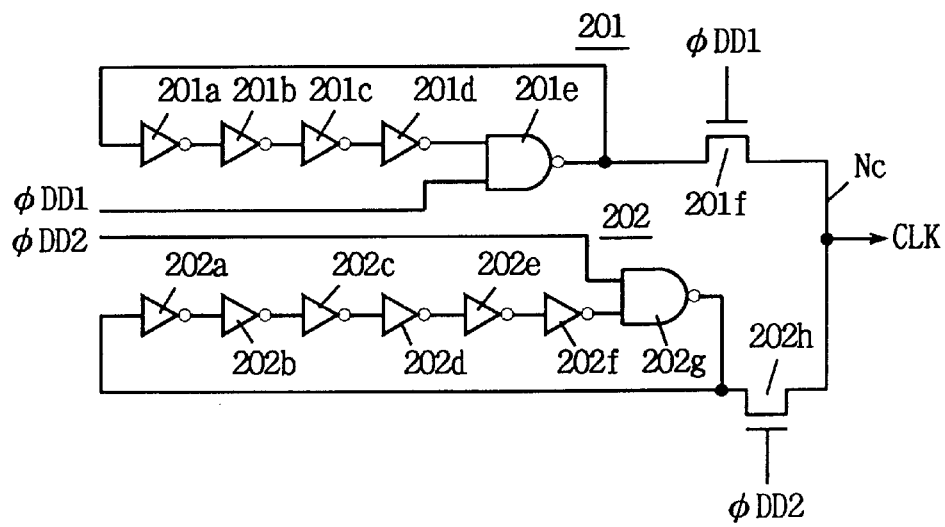
FIG. 16 schematically shows a structure of the oscillator shown in FIG. 15.

FIG. 16 shows a specific structure of variable-frequency oscillator circuit 20-1 shown in FIG. 15. In FIG. 16, first oscillator 201 includes four cascaded inverters 201a–201d, an NAND gate 201e receiving an output signal of inverter 201d and first disturb mode designating signal φDD1, and a transfer gate 201f which is turned on in response to first disturb mode designating signal φDD1 to transmit an output signal of NAND gate 201e to a node Nc. An output signal of NAND gate 201e is also transmitted to an input of inverter 201a.

Second oscillator 202 includes six cascaded inverters 202a–202f, an NAND gate 202g receiving an output signal of inverter 202f and second disturb mode designating signal φDD2, and a transfer gate 202h which is turned on to transmit an output signal of NAND gate 202g to node Nc when second disturb mode designating signal φDD2 is activated. Transfer gates 201f and 202h each are formed of an n-channel MOS transistor, and are turned on when respective disturb mode designating signals φDD1 and φDD2 are at the high level. Operation will be briefly described below.

When both disturb mode designating signals φDD1 and φDD2 are at the low level, the output signals of both NAND gates 201d and 202g are at the high level. In this state, both transfer gates 201f and 202h are off, and clock signal CLK on node Nc is at the low level of the inactive state. In the figure, node Nc is set to the high impedance state when both transfer gates 201f and 202h are off. However, there may be provided a resetting transistor, which discharges node Nc to the ground potential level when both signals φDD1 and φDD2 are at the low level. Alternatively, a resistance element for pull-down may be merely provided at node Nc.

When first disturb mode designating signal φDD1 attains the high level, NAND gate 201e acts as an inverter, and first oscillator 201 acts as a ring oscillator formed of five stages of inverters. When second disturb mode designating signal φDD2 is set to the high level, NAND gate 202g functions as an inverter, and second oscillator 202 operates as a ring oscillator formed of seven cascaded inverters. A ring oscillator has an oscillation period increased as the number of the inverters therein increases. Therefore, first oscillator 201 performs oscillation with a period shorter than that of second oscillator 202, and thus generates the clock signal of a shorter period. When first disturb mode designating signal φDD1 is activated to attain the high level, transfer gate 201f is turned on, and an oscillation signal applied from NAND gate 201e is transmitted to node Nc, so that clock signal CLK is continuously generated. When second disturb mode designating signal φDD2 is set to the high level, transfer gate 202h is turned on, and the oscillation signal generated by second oscillator 202 is transmitted to node Nc.

Figure 17:
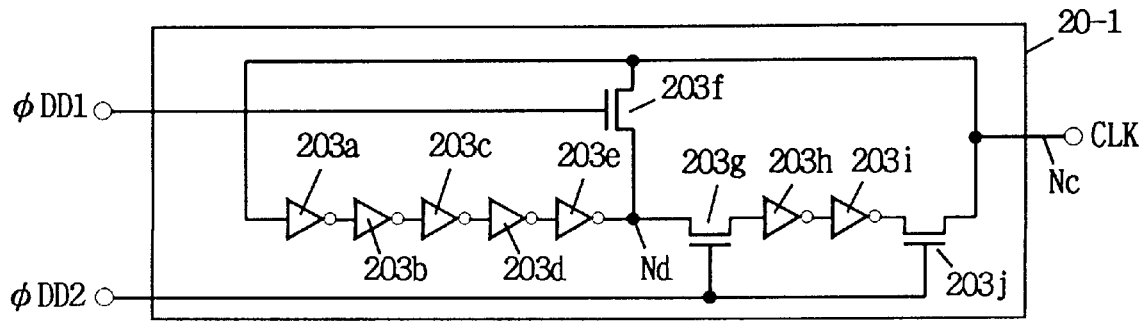
FIG. 17 shows a modification of the variable-frequency oscillator circuit shown in FIG. 12.

FIG. 17 shows a modification of variable-frequency oscillator circuit 20-1 shown in FIG. 12. In FIG. 17, variable-frequency oscillator circuit 20-1 includes five cascaded inverters 203a–203e, two cascaded inverters 203h and 203i for receiving an output signal of inverter 203e through transfer gate 203g, a transfer gate 203f which is turned on to transmit the output signal of inverter 203e to node Nc in response to first disturb mode designating signal φDD1, and a transfer gate 203f which is turned on to transmit an output signal of inverter 203i to node Nc in response to second disturb mode designating signal φDD2. Node Nc is also connected to an input of inverter 203a. Transfer gate 203i is turned on when second disturb mode designating signal φDD2 is activated. Operation will now be described below.

When both disturb mode designating signals φDD1 and φDD2 are at the low level, all of transfer gates 203f, 203g and 203j are off. In this state, since the output signals of inverters 203e and 203i are not transmitted to node Nc, clock signal CLK on node Nc does not change and thus maintains the low level (this can be achieved easily, e.g., by a pull-down resistance or a reset transistor). When first disturb mode designating signal φDD1 attains the high level, transfer gate 203f is turned on, and node Nd is connected to node Nc. Thereby, the output signal of inverter 203e is transmitted to node Nc. The output signal of inverter 203e is not transmitted to inverter 203h, so that clock signal CLK on node Nc changes in accordance with the oscillation frequency of the ring oscillator formed of inverters 203a–203e.

Meanwhile, when second disturb mode designating signal φDD2 attains the high level, both transfer gates 203g and 203j are turned on, and transfer gate 203f maintains the off state. In this state, all of seven inverters 203a–203i are cascaded, and clock signal CLK on node Nc changes in accordance with the oscillation frequency of the ring oscillator formed of seven inverters 203a–203i.

Figure 18:
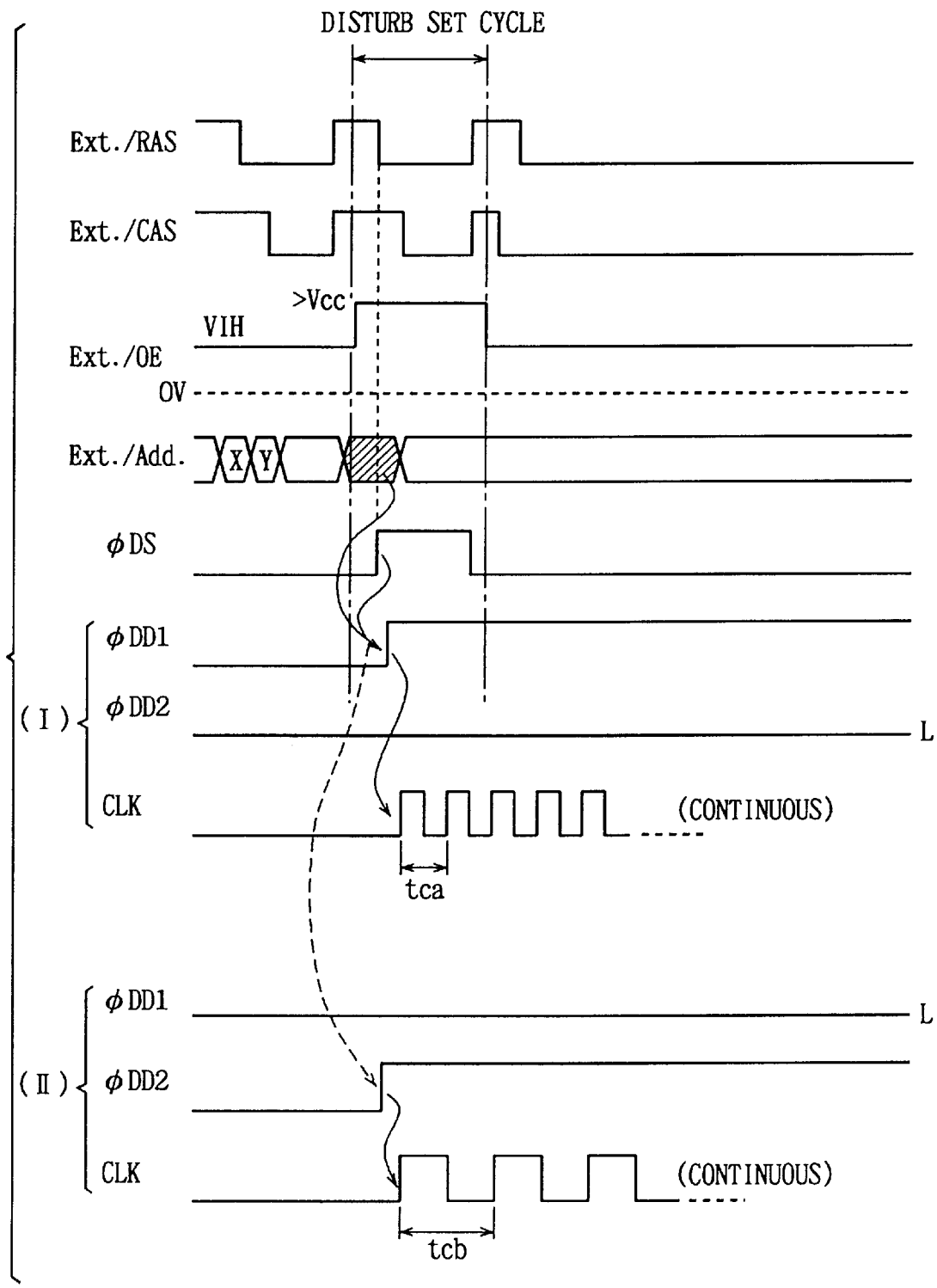
FIG. 18 is a waveform diagram representing operation of the variable-cycle setting circuit and variable-frequency oscillator circuit.

FIG. 18 represents entire operation of the semiconductor memory device of the second embodiment of the invention. FIG. 18 represents only an operation cycle for generating clock signal CLK and setting the period. The entire operation of the second embodiment of the invention will now be described below with reference to FIG. 18.

In the disturb mode set cycle, when (WCBR+super-Vcc) condition is satisfied, disturb mode setting instruction signal φDS issued from disturb mode setting detector 34 shown in FIG. 3 attains the high level. In response to the high level of disturb mode setting instruction signal φDS, cycle setting circuit 19-1 shown in FIG. 13 operates and one of first and second disturb mode designating signals φDD1 and φDD2 is activated to attain the high level in accordance with currently applied address signal (Ext.Add). In FIG. 18, at (I) is shown a state that first disturb mode designating signal φDD1 is activated to attain the high level, and at (II) is shown a state that the second disturb mode designating signal φDD2 is activated to attain the high level.

When one of disturb mode designating signals φDD1 and φDD2 is activated to attain the high level, one of the first and second oscillators 201 and 202 shown in FIG. 16 is activated, or transfer gate 203f or transfer gates 203g and 203j are turned on in FIG. 17. When first disturb mode designating signal φDD1 is set to the high level, clock signal CLK having a shorter period tca is generated. When second disturb mode designating signal φDD2 is set to the high level, clock signal CLK having a longer period tcb is generated.

According to the second embodiment of the invention, as described above, since it is possible to change the period of clock signal CLK which determines the period or frequency of the row selection operation activating signal internally generated by the semiconductor memory device, the period of clock signal CLK can be set in accordance with the operation conditions and test conditions of the semiconductor memory device, and it is possible to cope easily with change in the operation conditions and test conditions.

[Embodiment 3]

Figure 19:
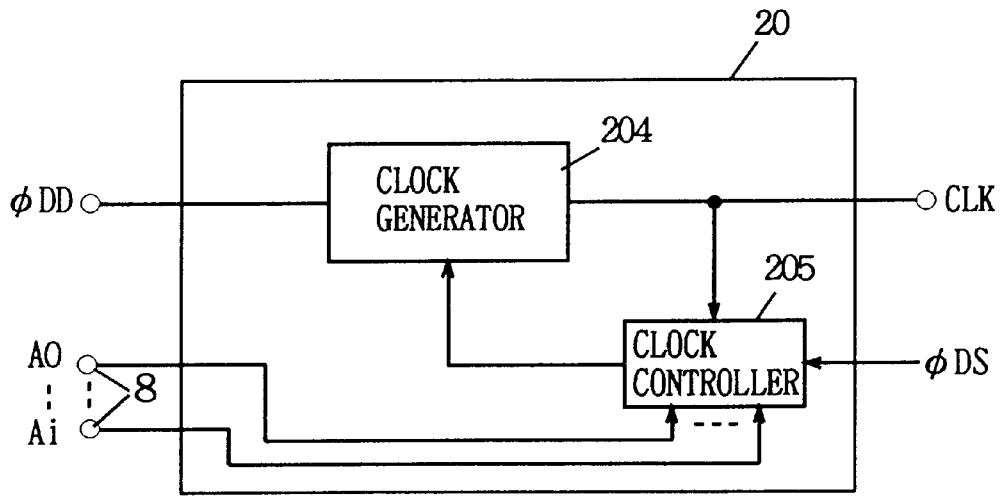
FIG. 19 schematically shows a third embodiment of the invention, and in particular shows a structure of a main portion of a semiconductor memory device.

FIG. 19 shows a third embodiment of the invention, and particularly shows a structure of a main portion of a semiconductor memory device. In FIG. 19, there is shown a structure of the internal cycle setting circuit 20. Internal cycle setting circuit 20 shown in FIG. 19 is applied to internal cycle setting circuit 20 shown in FIG. 3.

In FIG. 19, internal cycle setting circuit 20 includes a clock generator 204 which is activated to generate continuously the clock signal having a predetermined period when disturb mode designating signal φDD is activated, and a clock controller 205 which stops clock signal generating operation when the number of times of generation of clock signal CLK by clock generator reaches a predetermined value. Clock controller 205 is constructed such that the count of the clock signal to be counted is set by address signals A0–Ai applied to address signal input terminals 8 when disturb mode setting instruction signal φDS is activated.

In the disturb test, the leak quantity of charges accumulated in a memory cell strongly depends on the number of times of selection of the word lines other than that connected to the memory cell, i.e., the number of times of disturb. As the number of times of the word line selection (number of times of disturb) increases, the leak quantity of the accumulated charges increases. In a semiconductor memory device designed under a different design rule, a memory cell capacitor has a different capacitance value. Therefore, by changing the number of times of disturb in accordance with the type (family) of the semiconductor memory device, it is possible to execute the test under the optimum test condition, and thus the test can be executed accurately. Since the number of times of disturb can be changed in accordance with the operation power supply voltage condition which is also allowed in the second embodiment, the disturb test can be executed more specifically. More specifically, even in the case where the word line selection is successively performed independently from control by external control signals, word lines can be easily and accurately selected an intended number of times.

Figure 20:
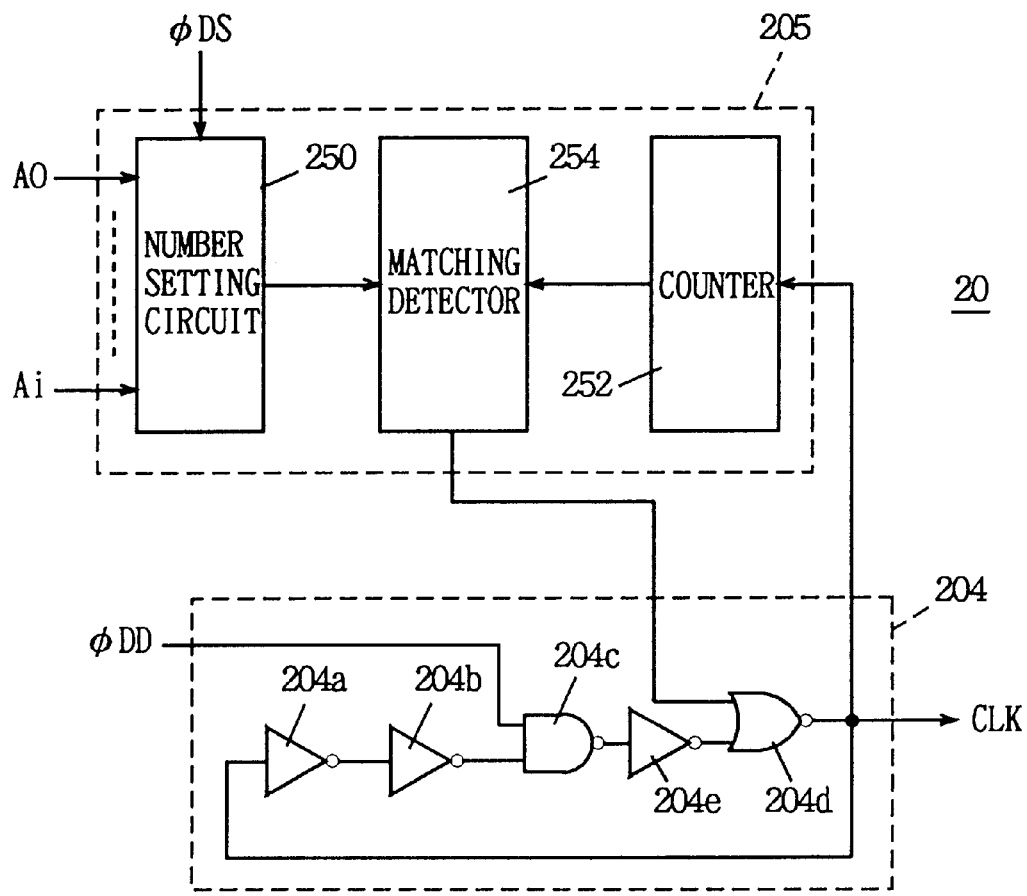
FIG. 20 schematically shows structures of a clock generator and a clock controller shown in FIG. 19.

FIG. 20 shows a specific structure of internal cycle setting circuit 20 shown in FIG. 19. In FIG. 20, clock controller 205 includes a number setting circuit 250 (i.e., circuit for setting the number of times) which is activated when disturb mode setting instruction signal φDS is activated, and stores count data indicative of the number of times of generation of clock signal to be counted in accordance with address signals A0–Ai applied from address signal input terminals 8, a counter 252 which counts the number of times of generation of clock signal CLK from clock generator 204, and a matching detector 254 for detecting matching of the count set in number setting circuit 250 with the count of counter 252. Number setting circuit 250 may not use all address signals A0–Ai, and may be constructed to set the count using only particular address signals among address signals A0–Ai. Counter 252 increments the count each time clock signal CLK falls. By counting the falling, generation (rising) of the subsequent clock signal CLK can be surely stopped.

Figure 21:
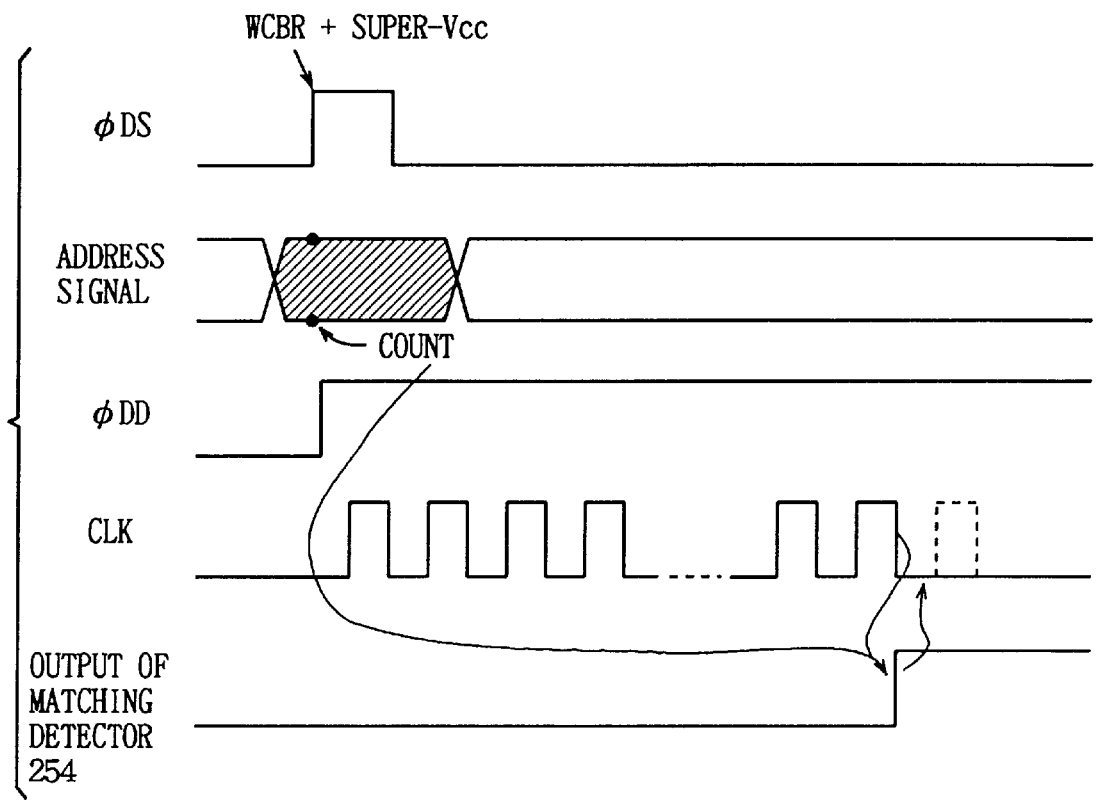
FIG. 21 is a waveform diagram representing operation of the clock generator shown in FIG. 20.

Clock generator 204 includes two inverters 204a and 204b, an NAND gate 204c receiving disturb mode designating signal φDD and an output signal of inverter 204b, inverter 204e receiving an output signal of NAND gate 204c, and an NOR gate 204d receiving an output signal of inverter 204e and a matching detection signal issued from matching detector 254. An output signal of NOR gate 204d is fed back to an input of inverter 204a. Now, operation of the internal cycle setting circuit shown in FIG. 20 will be described below with reference to an operation waveform diagram of FIG. 21.

When (WCBR+super-Vcc) condition is satisfied, disturb mode setting instruction signal φDS is activated to attain the high level. In accordance with the disturb mode setting instruction signal φDS at the high level, number setting circuit 250 is activated to take in all or some of address signals A0–Ai currently applied thereto and store data indicative of the count to be counted. Also at this time, disturb mode designating signal φDD is activated to attain the high level, and NAND gate 204c acts as an inverter. The output signal of matching detector 254 is at the low level, and NOR gate 204d also acts as an inverter. Therefore, clock generator 204 acts as a ring oscillator formed of five stages of inverters, and generates clock signal CLK.

Counter 252 counts the number of times of generation of clock signal CLK. Although the timing at which counter 252 starts the counting is described later, the counting starts in the cycle that the disturb test is actually performed (i.e., when signal φDD is at the high level and the CBR condition is designated). When the count of counter 252 matches with the count value set in number setting circuit 250, the output signal of matching detector 254 rises to the high level. Thereby, the output signal of NOR gate 204d in clock generator 204 is fixed at the low level, so that subsequent generation of clock signal CLK is stopped. As described above, when the number of times of generation of clock signal CLK reaches the preset value, generation of clock signal CLK is stopped. Specific structures of respective portions will be described below.

Figure 22:
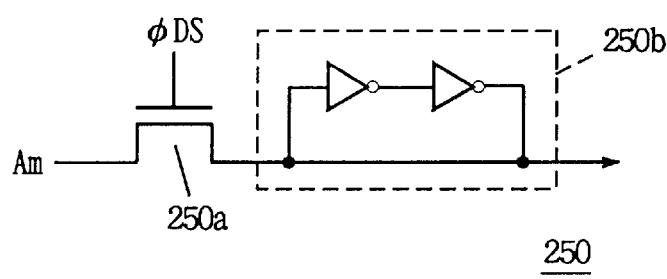
FIG. 22 shows an example of a structure of a number setting circuit shown in FIG. 20.

FIG. 22 shows an example of a structure of number setting circuit 250 shown in FIG. 20. In FIG. 22, number setting circuit 250 includes a transfer gate 250a which is responsive to disturb mode setting instruction signal φDS to pass address signal Am therethrough, and a latch circuit 250b which latches address signal Am transmitted from transfer gate 250a. Transfer gate 250a is formed of an n-channel MOS transistor, and passes address signal Am therethrough when disturb mode setting instruction signal φDS is at the high level. Number setting circuit 250 may be formed of another element such as a flip-flop.

Figure 23:
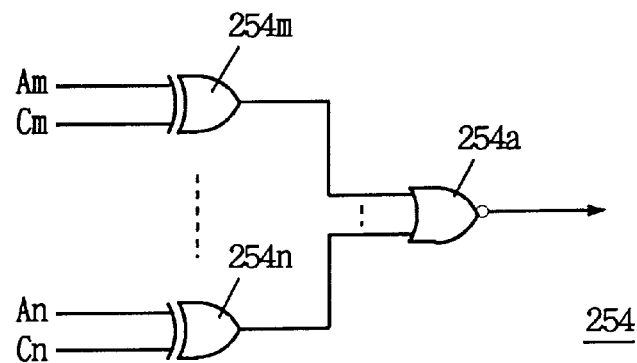
FIG. 23 shows an example of a structure of a matching detector shown in FIG. 20.

FIG. 23 shows an example of a structure of matching detector 254 shown in FIG. 20. In FIG. 23, matching detector 254 includes an EXOR gate 254m receiving address signal Am and a count output Cm of counter 252, an EXOR gate 254n receiving address signal An and an output count Cn of counter 252, and an NOR gate 254a receiving output signals of EXOR gates 254m to 254n. The number of EXOR gates 254m and 254n is determined depending on the count value to be counted. Address signals Am and An and count bit values Cm and Cn output from the counters are bits at the same digit positions, respectively. In addition, the address signals Am and An need not the same as those shown in FIG. 13. Operation will now be described below.

Each of EXOR gates 254m–254n outputs a signal at the low level when logical values of signals applied to the both inputs match each other. Therefore, in the case where the count Cm, . . . Cn, . . . of the counter does not match with set count Am, . . . , An, . . . , at least one of the output signals of EXOR gates 254m–254n attains the high level, and accordingly the output signal of NOR gate 254a attains the low level.

When the count Cm, . . . , Cn, . . . of the counter matches with set count Am, . . . , An, . . . , all the output signals of EXOR gates 254m–254n attains the low level, and accordingly the output signal of NOR gate 254a attains the high level. Thereby, generation of clock signal CLK can be stopped.

Figure 24:
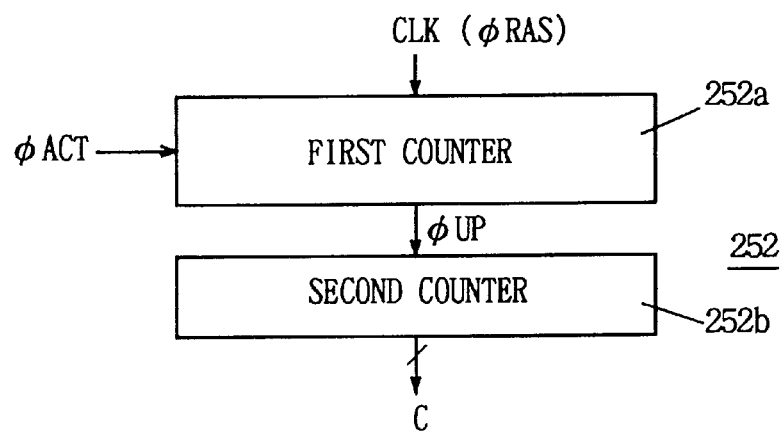
FIG. 24 schematically shows an example of a structure of a counter shown in FIG. 20.

FIG. 24 shows an example of a structure of the counter shown in FIG. 20. In FIG. 24, counter 252 includes a first counter 252a which is activated in response to an activation signal φACT to count clock signal CLK, and a second counter 252b which counts a count-up signal φUP applied from first counter 252a. The count of second counter 252b is applied to matching detector 254. In the disturb mode test, the internal address generating circuit successively selects the word lines.

In order to select the respective word lines equal number of times, the internal address generating circuit (reference number 10 in FIG. 3) is required to have the internally provided counter to count from the minimum value to the maximum value repeatedly multiple times. In this operation, if the count is set by the internal address signal, the counter for detecting the number of times of generation of the clock signal requires a large scaled structure. For example, in the case where the word lines are 1024 in number and the 1024 word lines are to be counted, the count of 10 bits is required. Therefore, disturb of one time is identified based on definition that 1024 forms one unit (it is determined that disturb is carried out once when the count reaches 1024), and the number of times of generation of the clock signal is set in the match detector based on the above definition. This structure can reduce the bit number of the address signal used therein, and correspondingly can reduce the scale and size of the number setting circuit 250. First counter 252a may be shared by the address counter contained in internal address generating circuit 10 shown in FIG. 3.

In the structure shown in FIGS. 20 and 24, the counter 252 counts clock signal CLK applied from clock generating circuit 204. However, counter 252 may be constructed to count row selection operation activating signal φRAS.

Figure 25:
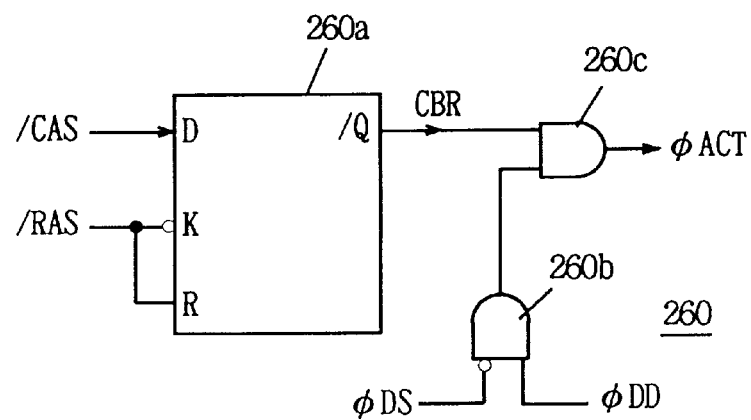
FIG. 25 schematically shows an example of a structure for generating an activation signal shown in FIG. 24.

FIG. 25 shows an example of a structure for generating a signal φACT which activates counter 252. In FIG. 25, activation control circuit 260 includes a D-type flip-flop 260a detecting the CBR condition, a gate circuit 260b receiving disturb mode setting instruction signal φDS and disturb mode designating signal φDD, and a gate circuit 260c receiving an output signal of gate circuit 260b and CBR detection signal CBR applied from D-type flip-flop 260a.

Figure 26:
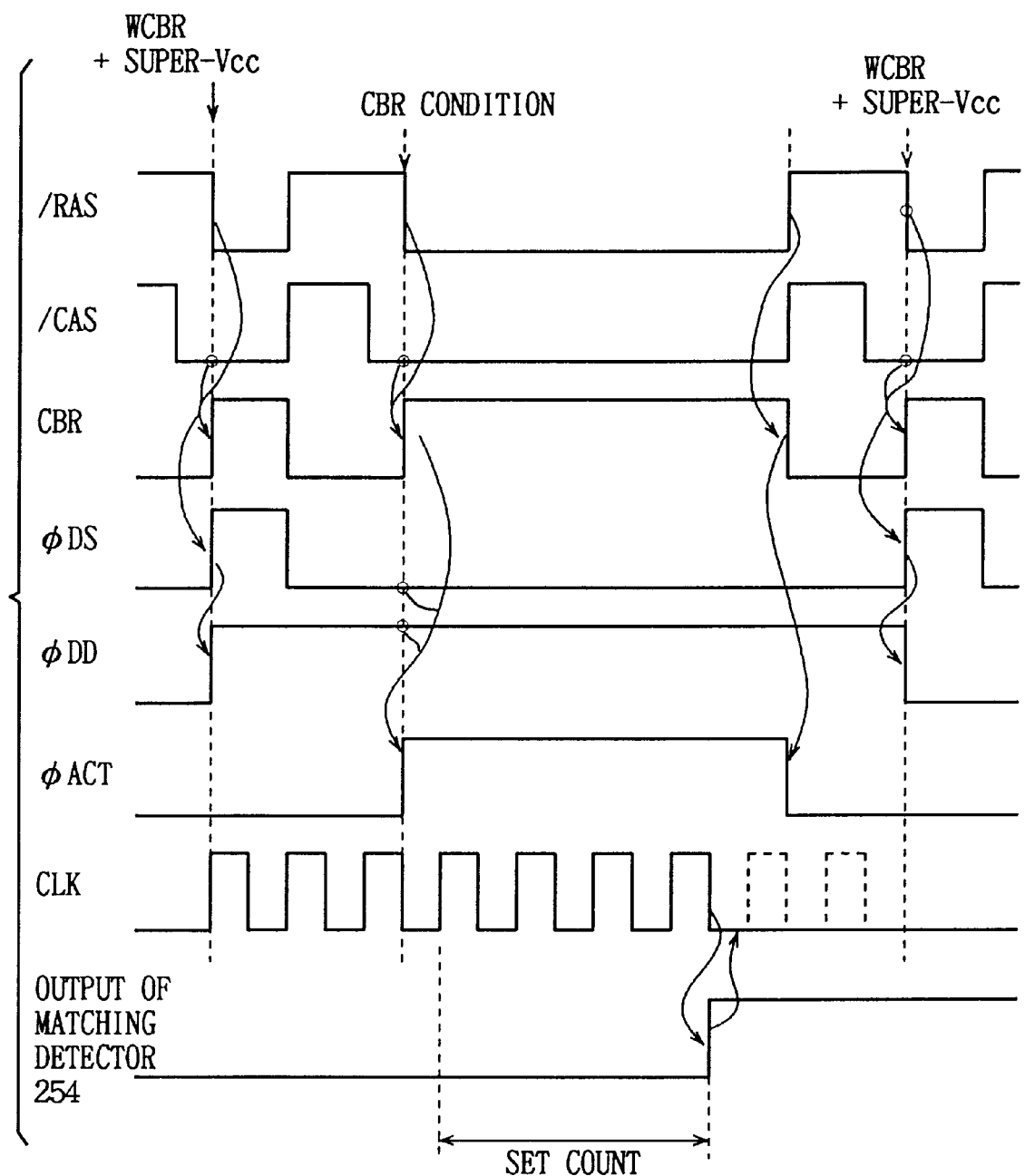
FIG. 26 is a signal waveform diagram representing operation of a control circuit shown in FIG. 25.

D-type flip-flop 260a receives column address strobe signal /CAS at its D-input, and row address strobe signal /RAS at its clock input K and reset input R. CBR detection signal CBR is issued from an inversion output /Q. D-type flip-flop 260a takes in and outputs the signal /CAS applied to D-input upon falling of signal /RAS, and is reset upon rising of signal /RAS. Gate circuit 260b outputs a signal at the high level when the signal φDS is at the low level and the signal φDD is at the high level. Gate circuit 260c outputs the active activation signal φACT at the high level when both of the CBR detection signal CBR and output signal of gate circuit 260b are at the high level. D-type flip-flop 260a may be shared by CBR detector 31 shown in FIG. 3. Then, operation of the control circuit shown in FIG. 25 will be described below with reference to a waveform diagram of FIG. 26.

In the disturb mode set cycle, when (WCBR+super-Vcc) condition is satisfied, CBR detection signal CBR applied from D-type flip-flop 260a attains the high level. Also at this time, signals φDD and φDS attain the high level. Therefore, the output signal of gate circuit 260b is at the low level, and activation signal φACT maintains the low level. In this set cycle, clock signal CLK is generated in accordance with signal φDD.

When the CBR condition for setting the self-disturb mode is subsequently set, CBR detection signal CBR applied from D-type flip-flop 260a is set to the high level. At this time, however, the (WCBR+super-Vcc) condition is not satisfied, so that the signal φDS maintains the low level. Signal φDD maintains the high level of the active state. In this state, therefore, activation signal φACT is activated to attain the high level in response to the rising of signal CBR, and first counter 252a shown in FIG. 24 is activated. Thereby, clock signal CLK is successively counted. When first and second counters 252a and 252b perform the counting to increase their counts to reach the set count value, the output signal of matching detector 254 (see FIG. 23) rises to the high level, and operation of generating the clock signal stops. In this state, activation signal φACT still maintains the high level of the active state. When the CBR condition is released, D-type flip-flop 260a is reset, and its output signal CBR and the activation signal φACT fall to the low level. When the cycle for resetting the disturb mode is performed, signals CBR and φDS rise to the high level. In response to change of signal φDS to the active state (high level), signal φDD is set to the low level, the output signal of gate circuit 260b is at the low level, and activation signal φACT maintains the low level.

Such a structure may be used that, upon change of activation signal φACT to the inactive state, the counts of first and second counters 252a and 252b are reset to predetermined initial values. A structure for maintaining the output signal of matching detector 254 continuously at the high level can be implemented merely by providing a latch circuit such as a flip-flop at the output of matching detector 254. Such a structure may be employed that the output signal of matching detector 254 is reset to the low level in response to deactivation of activation signal φACT. This structure can be easily achieved.

[Modification]

Figure 27:
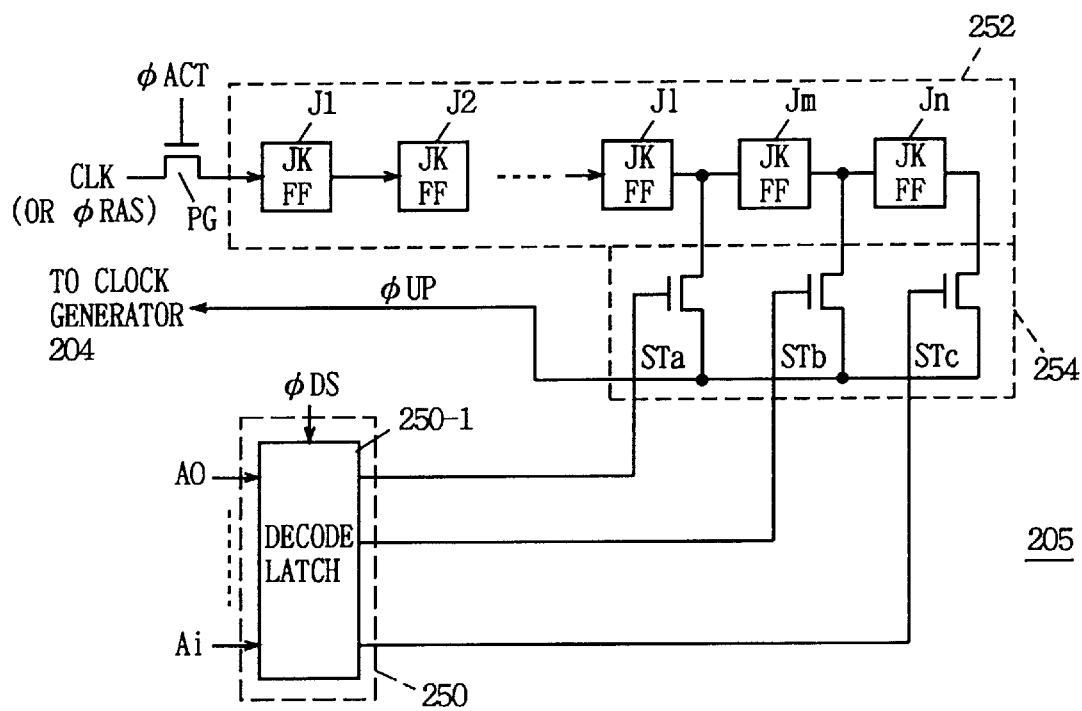
FIG. 27 schematically shows a structure of a modification of the third embodiment of the invention.

FIG. 27 shows a structure of a modification of the internal cycle setting circuit in the semiconductor memory device of the third embodiment of the invention. In FIG. 27, there is shown a structure of the clock controller 205 (FIG. 19) included in internal cycle setting circuit 20.

In FIG. 27, clock controller 205 includes number setting circuit 250, counter 252 and matching detector 254 similarly to the structure shown in FIG. 20. Number setting circuit 250, which includes a decode latch 250-1, latches and decodes a part or all of address signals A0–Ai applied thereto when disturb mode setting instruction signal φDS is active, and maintains one of a plurality of output signal lines active during the disturb mode operation. Decode latch 250-1 includes a decode circuit which is activated to decode the applied address signals when signal φDS is active, and a latch circuit which latches an output signal of the decode circuit in response to signal φDS. The latch circuit maintains the through state to pass the corresponding decoded output applied thereto when signal φDS is active, and is set to the latch state when signal φDS is inactive. In the latch state, the decode latch 250-1 latches and continuously outputs the signal applied in the through state.

Counter 252 includes JK-flip-flops (JKFF) J1–Jn which are cascaded and count clock signal CLK (or internal RAS signal φRAS) applied thereto through a transfer gate PG adapted to be turned on in response to activation signal φACT. The cascaded JK-flip-flops form asynchronous counter which counts falling of clock signal CLK (or internal RAS signal φRAS) as will be described later in detail.

Matching detector 254 includes select gates STa, STb and STc which select output signals of downstream (highest order) JK-flip-flops (J1, Jm and Jn in FIG. 27) of counter 252 in accordance with the signal applied from decode latch 250-1, respectively. The signal selected by matching detector 254 is applied, as matching detection signal φUP, to clock generator 204 shown in FIG. 20. Operation will now be briefly described below.

Figure 28:
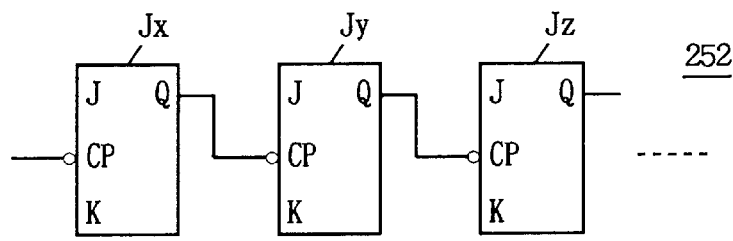
FIG. 28 shows more specifically a manner of connection of flip-flops in a counter shown in FIG. 27.

Decode latch 250 takes in and decodes the address signal for setting the count in the disturb mode set cycle, and activates the corresponding output signal. In matching detector 254, one of select gates STa–STc is turned on in accordance with the output signal of decode latch 250-1. When the disturb test starts, transfer gate PG is turned on, and counter 252 performs the counting in synchronization with falling of clock signal CLK or internal RAS signal φRAS. It is assumed that JK-flip-flops J1–J(l–1) correspond to the address number from the minimum address (00 . . . 0) of the row address designating the word line to the maximum address (11 . . . 1) of the same. When every word line is selected one time, the output signal of JK-flip-flop Jl rises to the high level in response to falling of the output signal of JK-flip-flop J(l–1) from the high level to the low level. When every word line is selected twice, the output signal of JK-flip-flop Jl falls to the low level, and responsively the output signal of JK-flip-flop Jm at the next position rises to the high level. In matching detector 254, therefore, by selecting the output signals of JK-flip-flops Jl–Jn for application to NOR gate 204d (see FIG. 20) of clock generator 204 as count-up signal φUP, clock signal CLK can be generated multiple times equal to the set number of disturb times FIG. 28 shows a manner of connection of the JK-flip-flops included in counter 252. FIG. 28 illustrates three JK-flip-flops. As shown in FIG. 28, JK-flip-flops Jx, Jy and Jz apply their outputs Q to clock input terminals Cp of the respective succeeding JK-flip-flops. Each clock input terminal Cp is of a down edge trigger type, and each of JK-flip-flops Jx-Jz changes the logical state of the signal at its output Q in response to falling of the signal applied to clock input Cp.

Figure 29:
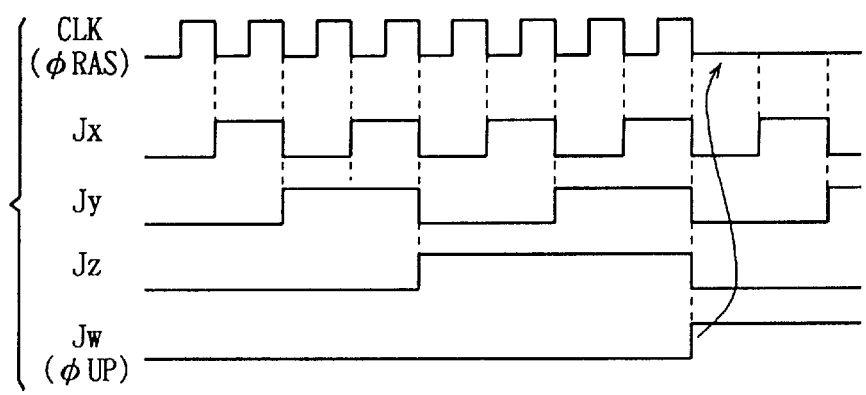
FIG. 29 is a signal waveform diagram representing operation of flip-flops shown in FIG. 28.

Thus, as shown in FIG. 29, each JK-flip-flop changes the logical state of its output signal in response to falling of the output signal of the immediately preceding JK-flip-flop. By selecting the output signal of appropriate JK-flip-flop, the semiconductor memory device can internally operate to stop generation of clock signal CLK after the word lines are selected set times. FIG. 29 illustrates a state that the output signal of JK-flip-flop Jw (not shown) subsequent to flip-flop Jz is used as matching detection signal φUP.

According to the third embodiment, as described above, the number of times of generation of the clock signal can be changed or set, so that the semiconductor memory device can internally select intended number of times of the selection of word lines, and thus the test can be accurately performed by changing the test conditions.

According to the invention, as described above, the row address signal and the row selection activating signal are internally generated for successively selecting the word lines in a particular operation mode such as a disturb test, so that the word lines can be successively and rapidly selected without being affected by the external control signals, and thus the time required for executing the particular operation mode can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array including a plurality of memory cells arranged in a matrix of rows and columns;
mode detecting means coupled to receive an operation mode designating signal and responsive thereto for detecting that said operation mode designation signal designate a predetermined particular operation mode to generate a mode detection signal indicative of the result of detection;
clock generation means coupled to receive said mode detection signal, for continuously and repetitively generating a clock signal having a predetermined period when activated in response to said mode detection signal being active to indicate that said predetermined particular operation mode is designated;
internal address generating means coupled to receive said clock signal and responsive thereto for generating an internal address signal independent of an externally applied address signal at each application of said clock signal; and
row selection means coupled to receive said clock signal and said internal address signal and activated in synchronization with said clock signal for selecting a row of memory cells in said memory array in accordance with said internal address signal.

2. The semiconductor memory device according to claim 1, wherein said mode detecting means includes gate means coupled between said clock generation means and said internal address generating means and responsive to said mode detection signal being active for transferring said clock signal to said internal address generating means.

3. The semiconductor memory device accordance with claim 1, wherein said mode detecting means includes,
mode setting means coupled to receive said operation mode designation signal and for generating a mode setting signal in response to said operation mode designating signal indicating a setting of the particular operation mode, and
mode control means coupled to receive said mode setting signal, for generating said mode detection signal onto said clock generation means in response to said mode setting signal.

4. The semiconductor memory device according to claim 3, wherein said mode detecting means includes gate means coupled to receive said mode setting signal, for inhibiting transfer of said clock signal from said clock generation means to said internal address generation means and said row selection means in response to said mode setting signal being active to indicate the setting of the particular operation mode.

5. The semiconductor memory device according to claim 4, wherein said mode detecting means includes start means coupled to receive said operation mode designation signal, for allowing said gate means to pass the clock signal from said clock generating means to said internal clock generation means to said internal address generation means and said row selection means in response to said operation mode designation signal indicating a start of said predetermined particular operation mode.

6. The semiconductor memory device according to claim 1, further comprising,
refresh mode detection means coupled to receive a refresh mode designating signal, for generating a refresh instructing signal at predetermined intervals onto said row selection means and said internal address generation means in response to said refresh mode designating signal being active to designate a refresh mode operation, said refresh mode detection means including inhibition means coupled to receive said mode detection signal for inhibiting generation of said refresh instructing signal.

7. The semiconductor memory device according to claim 6, further comprising
prohibit gate means coupled between said refresh mode detection means and said row selection means for prohibiting transfer of said refresh instructing signal from said refresh mode detection means to said row selection means in response to said mode detection signal being active.

8. The semiconductor memory device according to claim 1, wherein said mode detecting means includes completion means coupled to receive said operation mode designating signal, for inhibiting transfer of said clock signal from said clock generation means to said row selection means and said internal address generation means in response to said operation mode designating signal indicating a completion of said particular operation mode.

9. The semiconductor memory device according to claim 8, wherein said mode detecting means includes reset means coupled to receive said operation mode designation signal, for deactivating said clock generation means to stop the generation of said clock signal in response to said operation mode designating signal indicating a resetting of said predetermined particular mode operation.

10. The semiconductor memory device according to claim 1, wherein said mode detecting means includes cycle setting means coupled to receive a period specifying information and said operation mode designating signal, for generating a period designating signal to said clock generation means, and
said clock generation means includes selection means coupled to receive said period designating signal for establishing a period of said clock signal.

11. The semiconductor memory device according to claim 10, wherein said clock signal generation means includes oscillation means generating said clock signals of different periods when activated, and said cycle setting means designates one of said different periods and activates said oscillation means.

12. The semiconductor memory device according to claim 11, wherein said oscillation means includes an odd number of inverters, and connection means responsive to said period designating signal for selecting inverters among said odd number of inverters to connect the selected inverters in a ring form.

13. The semiconductor memory device according to claim 10, wherein said period designating signal is applied as said mode detection signal to said clock generation means.

14. The semiconductor memory device according to claim 1, wherein said clock generation means includes stop means coupled to receive said clock signal, for counting a number of times of generation of said clock signals to inhibit the generation of said clock signal in response to the count attaining a preselected value.

15. The semiconductor memory device according to claim 1, wherein said clock generation means includes,
clock generator activated in response to said mode detection signal being active to generate said clock signal continuously,
storage unit storing a predetermined count,
counter coupled to receive said clock signal for counting the clock signal, and
match detector coupled to said storage unit and said counter, for comparing the predetermined count and a count of said counter to generate a match signal to said clock generator in accordance with the result of comparison, said match signal inhibiting the generation of said clock signal in response to said result of comparison indicating that said count and said predetermined count coincide with each other.

16. The semiconductor memory device according to claim 15, wherein said storage unit comprises a storage element storing externally applied data indicating said predetermined count in response to said operation mode designating signal indicating an operation mode of storing the data.

17. The semiconductor memory device according to claim 15, wherein said rows comprises a predetermined number of word lines each connecting a row of memory cells, and said counter includes,
a first counter coupled to receive the clock signal for counting said clock signal to generate a count up signal when the count reaches the predetermined number, and
a second counter coupled to receive the count up signal for counting the count up signal for application to said comparator.

18. The semiconductor memory device according to claim 1, wherein said clock generation means includes,
a clock generator for generating said clock signal upon activation in response to said mode detection signal being active,
a multibit counter coupled to receive said clock signal for counting,
a latch storing and outputting a selection signal indicating a number of generation of said clock signal, and
selector coupled to said latch and said clock generator for selecting an output of a bit of said multibit counter in accordance with said selection signal, to apply said output to said clock generator for inhibiting the generation of said clock signal.

19. The semiconductor memory device according to claim 18, wherein said latch comprises a decode latch responsive to said operation mode designating signal designating a data storage operation for taking and decoding an externally applied data to generate and latch said selection signal.

20. A semiconductor memory device comprising:
- a memory cell array including a plurality of memory cells arranged in rows and columns;
- row selection circuitry for selecting a row of memory cells in said memory cell array when activated; and
- clock generation/application circuitry including;
    - a clock generator for generating a clock signal having a predetermined period when activated; and
    - a mode detector responsive to a plurality of external signals for detecting a predetermined operation mode and activating said clock generator when said predetermined operation mode is designated by said plurality of external signals, for continuously and repetitively applying said clock signal to said row selection circuitry for activation thereof in synchronization with said clock signal when said clock generator is activated.

* * * * *